US008483250B2

(12) United States Patent
Kamatani

(10) Patent No.: US 8,483,250 B2
(45) Date of Patent: Jul. 9, 2013

(54) SEMICONDUCTOR LASER DRIVING DEVICE AND IMAGE FORMING APPARATUS HAVING THE SAME

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 134 days.

(21) Appl. No.: 12/810,122

(22) PCT Filed: Dec. 15, 2008

(86) PCT No.: PCT/JP2008/073150
§ 371 (c)(1),
(2), (4) Date: Jun. 22, 2010

(87) PCT Pub. No.: WO2009/084467
PCT Pub. Date: Jul. 9, 2009

(65) Prior Publication Data
US 2010/0278202 A1 Nov. 4, 2010

(30) Foreign Application Priority Data

Dec. 28, 2007 (JP) ................................. 2007-339677

(51) Int. Cl.
H01S 3/00 (2006.01)
(52) U.S. Cl.
USPC ................ 372/38.02; 372/29.01; 372/29.011;
372/29.015; 372/38.1; 372/38.03; 372/38.07
(58) Field of Classification Search
USPC ............... 372/29.01, 29.011, 29.014, 29.015,
372/38.1, 38.01, 38.03, 38.07, 38.02
See application file for complete search history.

(56) References Cited

U.S. PATENT DOCUMENTS

| 4,890,288 | A | * | 12/1989 | Inuyama et al. | ................. 372/31 |
| 5,536,934 | A | * | 7/1996 | Hayashi | ...................... 250/214.1 |
| 6,324,197 | B1 | * | 11/2001 | Suda | .......................... 372/38.01 |
| 6,504,857 | B1 | * | 1/2003 | Iwazaki | ....................... 372/38.1 |
| 6,597,485 | B1 | * | 7/2003 | Ikeuchi et al. | ................. 398/192 |

(Continued)

FOREIGN PATENT DOCUMENTS

JP 05-190950 * 7/1993
JP 8-295048 11/1996

(Continued)

OTHER PUBLICATIONS

JP2006-278403 (English translation) pp. 1-18.*

(Continued)

Primary Examiner — Jessica Stultz
Assistant Examiner — Delma R Forde
(74) Attorney, Agent, or Firm — Cooper & Dunham LLP

(57) ABSTRACT

A semiconductor laser driving device and an image forming apparatus are disclosed that are capable of accurately detecting the deterioration of the semiconductor laser with a smaller circuit size and regardless of the variation of the characteristics of the semiconductor laser and the use conditions of the semiconductor laser by adding a minimum circuit are disclosed. In the semiconductor laser driving device, the output voltage generated by an operational amplifier circuit by amplifying a voltage difference between a monitoring voltage (Vm) and a predetermined reference voltage (Vref) is transmitted to a bias current generating circuit unit as a bias current setting voltage (Vbi) through a sample/hold circuit having a switch (SW1) and a sample/hold capacitor (Csh). When the bias current setting voltage (Vbi) is greater than a predetermined voltage, a deterioration detecting circuit transmits a deterioration detecting signal indicating that the deterioration of the semiconductor laser is detected.

19 Claims, 15 Drawing Sheets

U.S. PATENT DOCUMENTS

| | | |
|---|---|---|
| 2003/0035451 A1 | 2/2003 | Ishida et al. |
| 2004/0032890 A1 | 2/2004 | Murata |
| 2007/0147451 A1* | 6/2007 | Sakaguchi .............. 372/38.02 |
| 2008/0067953 A1* | 3/2008 | Kranz .................... 315/291 |
| 2008/0169771 A1* | 7/2008 | Nakamura ............... 315/291 |
| 2008/0192816 A1* | 8/2008 | Momtaz .................. 375/233 |
| 2008/0279240 A1 | 11/2008 | Kamatani et al. |
| 2009/0141762 A1 | 6/2009 | Kamatani |
| 2010/0026383 A1* | 2/2010 | Ahrari et al. ............ 327/551 |
| 2011/0037630 A1* | 2/2011 | McLachlan et al. ...... 341/120 |

FOREIGN PATENT DOCUMENTS

| | | |
|---|---|---|
| JP | 9-83051 | 3/1997 |
| JP | 2000-280522 | 10/2000 |
| JP | 2002-329924 | 11/2002 |
| JP | 3466599 | 8/2003 |
| JP | 2005-57069 | 3/2005 |
| JP | 2006-278403 | 10/2006 |
| JP | 2007-73543 | 3/2007 |
| JP | 2009-135281 | 6/2009 |
| JP | 2009-164193 | 7/2009 |
| WO | WO2009/084467 A1 | 7/2009 |

OTHER PUBLICATIONS

JP2002-329924 (English translation) pp. 1-14.*
Translation of JP05-190950.*
International Search Report in PCT/JP2008/073150.

* cited by examiner

--Related Art--

SEMICONDUCTOR LASER DRIVING DEVICE AND IMAGE FORMING APPARATUS HAVING THE SAME

TECHNICAL FIELD

The present invention relates to a semiconductor laser driving device capable of controlling an emitted light amount of the semiconductor laser of the semiconductor laser driving device. More particularly, the present invention relates to a semiconductor laser driving device and an image forming apparatus having the semiconductor laser driving device further capable of detecting the deterioration of the semiconductor laser.

BACKGROUND ART

Conventionally, a general purpose semiconductor laser used for recording in an image forming apparatus has the so-called APC (Automatic Power Control) function to control an emitted light amount of the semiconductor laser. When the APC function is performed, the emitted light amount is periodically detected by a photo sensor disposed in the vicinity of the semiconductor laser, and a detection signal in accordance with the detected light amount is output from photo sensor to feed back to the driving circuit which drives the semiconductor laser. By having this function, the emitted light amount is controlled to produce a desired amount of laser light.

FIG. 15 is a block diagram showing a configuration of a conventional semiconductor laser driving device.

As shown in FIG. 15, when a photo diode PD receives an emitted laser light from a semiconductor laser such as a laser diode LD, the photo diode PD outputs a monitor current Im in accordance with the received light amount of the laser light.

Then, the monitor current Im is converted into a monitoring voltage Vm by an I/V converting circuit 101. The monitoring voltage Vm is compared with a predetermined reference voltage by a comparison circuit 102. Then, the comparison circuit 102 outputs a signal indicating the voltage difference. A sample hold circuit 103 samples and holds the voltage of the signal transmitted from the comparison circuit 102 in a nonimaging region at the timing of an external APC signal. Then, the sample hold circuit 103 transmits the held voltage to a driving current setting circuit 104 as the driving voltage in an imaging region. The driving current setting circuit 104 generates a driving current in accordance with the received driving voltage and supplies the generated driving current to the laser diode LD. In this configuration, the comparison circuit 102 and the sample hold circuit 103 constitute an APC circuit.

However, it is known that the service lifetime of the semiconductor laser LD is generally shorter than that of the other parts. Therefore, the semiconductor laser LD may be exchanged before becoming out of order by detecting a time-dependent deterioration of the semiconductor laser LD and issuing an alarm indicating that the deterioration is detected.

FIGS. 16 and 17 show typical cases where the characteristics of a semiconductor laser LD are deteriorated.

As shown in FIGS. 16 and 17, when the semiconductor laser LD deteriorates over time or for another reason, the threshold current Ith of the semiconductor laser LD may be increased, and as a result, the slope of the emitted light amount with respect to the driving current with the semiconductor laser LD being deteriorated is obviously more inclined than that before its being deteriorated. Because of this feature, in order to obtain the same emitted light amount from the semiconductor laser LD after the semiconductor laser LD has become deteriorated, a larger driving current Iop is required to be supplied to the semiconductor laser LD than before the semiconductor laser LD is deteriorated. When the semiconductor laser LD is further deteriorated, the driving current required to be supplied to the semiconductor laser LD may be greater than an absolute maximum rated value Imax, and then the semiconductor laser LD may malfunction.

In a case where the deterioration of the semiconductor laser LD is not detected until the semiconductor laser LD becomes unable to emit light, there may be no preparation to replace the semiconductor laser LD until the semiconductor laser LD becomes unable to emit light, either. As a result, the deteriorated semiconductor laser LD may not be replaced almost immediately after the semiconductor laser LD becomes unable to emit light. Further, there may be another case where the semiconductor laser LD becomes unable to emit light during its manufacturing process. In any case, when the deterioration of the semiconductor laser LD can be detected at any early stage, it may become possible to replace the semiconductor laser LD more easily with lower cost.

To that end, as shown in FIG. 18, a method is disclosed in which a current flowing through the semiconductor laser LD is detected using a resistor 111 and an amplifying circuit 112, the resistor 111 being connected in series with the semiconductor laser LD. The detected current value is compared with a predetermined reference current value in a comparison circuit 113. Then, when the detected current value as the comparison result is greater than the predetermined reference current value, the comparison circuit 113 outputs a signal indicating that the semiconductor laser LD is deteriorated. (see, for example, Patent Document 1)

[Patent Document 1] Japanese Laid-Open Patent Application No. 2000-280522

DISCLOSURE OF THE INVENTION

Problems to be Solved by the Invention

However, as shown in FIG. 18, when the resistor 111 is connected in series with the semiconductor laser LD and the amplifying circuit 112 is also provided, there may be a concern that the waveform of the current flowing through the semiconductor laser LD may be deformed due to, for example, the parasitic capacitance and the input leakage current by the resistor 111 and the amplifying circuit 112. Further, when the resistor 111 is disposed inside an IC, the resistance of the resistor 111 may largely vary, thereby degrading the accuracy of detecting the deterioration of the semiconductor laser LD due to the variation of the characteristics of the semiconductor lasers LD. On the other hand, when the resistor 111 is disposed outside the IC, it may become possible to control the variation of the resistance value of the resistors 111; however the above problem of deforming the current waveform remains unsolved.

The present invention is made in light of the above problems and may provide a semiconductor laser driving device and an image forming apparatus capable of accurately detecting the deterioration of the semiconductor laser by minimally changing the circuit configuration or a setting value in accordance with the characteristics of each semiconductor laser, thereby keeping the circuit size small, without being affected by the variation of the characteristics of the semiconductor laser and the using conditions of the semiconductor laser.

Means for Solving the Problems

According to an aspect of the present invention, a semiconductor laser driving device includes a semiconductor laser driven by a driving current which is a combination of a bias current and a switching current and is capable of automatically controlling a current supplied to the semiconductor laser so that a light amount of the semiconductor laser is substantially equal to a predetermined light amount. The semiconductor laser driving device further includes:

a switching current generating circuit unit generating the switching current in accordance with an input switching current setting signal and supplying the generated switching current to the semiconductor laser in accordance with an input control signal;

a bias current generating circuit unit generating the bias current in accordance with an input bias current setting signal and supplying the generated bias current to the semiconductor laser;

a control circuit unit detecting an emitted light amount of the semiconductor laser and controlling an operation of the bias current generating circuit unit by generating the bias current setting signal so that the detected emitted light amount is substantially equal to a desired value; and a deterioration detecting circuit unit detecting a deterioration of the semiconductor laser based on the bias current setting signal transmitted from the control circuit unit and generating and transmitting a deterioration detecting signal indicating a result of the deterioration detection.

Further, the control circuit unit may control the operation of the switching current generating circuit unit by generating the switching current setting signal so that the detected emitted light amount is substantially equal to a desired value, and the deterioration detecting circuit unit may detect a deterioration of the semiconductor laser based on the bias current setting signal transmitted from the control circuit unit and the switching current setting signal and may generate and transmit a deterioration detecting signal indicating a result of the deterioration detection.

Further, according to another aspect of the present invention, a semiconductor laser driving device includes a semiconductor laser driven by a driving current which is a combination of a bias current and a switching current and is capable of automatically controlling a current supplied to the semiconductor laser so that a light amount of the semiconductor laser is substantially equal to a predetermined light amount. The semiconductor laser driving device further includes:

a switching current generating circuit unit generating the switching current in accordance with an input switching current setting signal and supplying the generated switching current to the semiconductor laser in accordance with an input control signal;

a bias current generating circuit unit generating the bias current in accordance with an input bias current setting signal and supplying the generated bias current to the semiconductor laser;

a control circuit unit detecting an emitted light amount of the semiconductor laser and controlling an operation of the switching current generating circuit unit by generating the switching current setting signal so that the detected emitted light amount is substantially equal to a desired value; and a deterioration detecting circuit unit detecting a deterioration of the semiconductor laser based on the switching current setting signal transmitted from the control circuit unit and generating and transmitting a deterioration detecting signal indicating a result of the deterioration detection.

Further, when the bias current setting signal indicates that the bias current greater than a predetermined value is to be generated, the deterioration detecting circuit unit may generate and transmit a predetermined deterioration detecting signal indicating that the deterioration of the semiconductor laser is detected.

Further, when the switching current setting signal indicates that the switching current greater than a predetermined value is to be generated, the deterioration detecting circuit unit may generate and transmit a predetermined deterioration detecting signal indicating that the deterioration of the semiconductor laser is detected.

Further, the control circuit unit may include:

a light amount detecting circuit generating a monitoring voltage in accordance with the detected emitted light amount;

a first operational amplifier circuit amplifying a voltage difference between the monitoring voltage and a predetermined first reference voltage and transmitting the amplified voltage difference, and a first sample/hold circuit sampling and holding the output voltage of the first operational amplifier circuit and generating a voltage for the bias current setting signal, wherein when the voltage generated by the first sample/hold circuit indicates that the bias current greater than a predetermined value is to be generated, the deterioration detecting circuit unit generates and transmits a predetermined deterioration detecting signal indicating that a deterioration of the semiconductor laser is detected.

Further, the control circuit unit may include:

a light amount detecting circuit generating a monitoring voltage in accordance with the detected emitted light amount;

a second operational amplifier circuit amplifying a voltage difference between the monitoring voltage and a predetermined second reference voltage and transmitting the amplified voltage difference, and a second sample/hold circuit sampling and holding the output voltage of the second operational amplifier circuit and generating a voltage for the switching current setting signal, wherein when the voltage generated by the second sample/hold circuit indicates that the switching current greater than a predetermined value is to be generated, the deterioration detecting circuit unit generates and transmits a predetermined deterioration detecting signal indicating that a deterioration of the semiconductor laser is detected.

Further, when the deterioration of the semiconductor laser is detected, the deterioration detecting circuit unit may cause the output terminal of the first sample/hold circuit to be connected to a predetermined voltage so that the bias current is decreased.

Further, when the deterioration of the semiconductor laser is detected, the deterioration detecting circuit unit may cause the output terminal of the second sample/hold circuit to be connected to a predetermined voltage so that the switching current is decreased.

Further, the deterioration detecting circuit unit may include:

a first voltage generating circuit generating and transmitting a predetermined first voltage; and a first voltage comparison circuit comparing the output voltage of the first sample/hold circuit with the first voltage and generating and transmitting the deterioration detecting signal indicating the comparison result.

Further, the deterioration detecting circuit unit may include:

a second voltage generating circuit generating and transmitting a predetermined second voltage; and a second voltage comparison circuit comparing the output voltage of the second sample/hold circuit with the second voltage and generating and transmitting the deterioration detecting signal indicating the comparison result.

Further, the first voltage generating circuit may include a unit to change the value of the first voltage.

Further, the second voltage generating circuit may include a unit to change the value of the second voltage.

Further, the bias current generating circuit unit may include:

a first voltage-current converting circuit converting the voltage for the bias current setting signal into a current; and a bias current setting resistor through which the current converted by the first voltage-current converting circuit flows.

Further, the switching current generating circuit unit may include:

a second voltage-current converting circuit converting the voltage for the switching current setting signal into a current;

a switching current setting resistor through which the current converted by the second voltage-current converting circuit flows; and a switching current control switch controlling the output of the switching current generated by the second voltage-current converting circuit and the switching current setting resistor in response to an externally input signal.

Further, the control circuit unit may include:

a light amount detecting circuit generating a monitoring voltage in accordance with the detected emitted light amount; and a first driving code generating circuit comparing a digital code obtained by A/D-converting the monitoring voltage with a predetermined first reference code, generating a first driving code indicating the comparison result, and transmitting the generated first driving code as the bias current setting signal, wherein when the first driving code indicates that the bias current greater than a predetermined value is to be generated, the deterioration detecting circuit unit generates and transmits a predetermined deterioration detecting signal indicating that a deterioration of the semiconductor laser is detected.

Further, the control circuit unit may include:

a light amount detecting circuit generating a monitoring voltage in accordance with the detected emitted light amount; and a second driving code generating circuit comparing a digital code obtained by A/D-converting the monitoring voltage with a predetermined second reference code and generating a second driving code indicating the comparison result as the switching current setting signal, wherein when the second driving code indicates that the switching current greater than a predetermined value is to be generated, the deterioration detecting circuit unit generates and transmits a predetermined deterioration detecting signal indicating that a deterioration of the semiconductor laser is detected.

Further, the bias current generating circuit unit may include:

a first current-output-type D/A converting circuit generating and transmitting the bias current in accordance with the first driving code.

Further, the switching current generating circuit unit may include:

a second current-output-type D/A converting circuit generating and transmitting the switching current in accordance with the second driving code; and a switching current control switch controlling the output of the switching current generated by the second D/A converting circuit in response to an externally input signal.

Further, the first D/A converting circuit may limit the generating bias current to be equal to or less than a current value in accordance with an externally input control signal.

Further, the second D/A converting circuit may limit the generating switching current to be equal to or less than a current value in accordance with an externally input control signal.

According to another aspect of the present invention, an image forming apparatus includes any of the above semiconductor laser driving devices.

Effects of the Present Invention

In a semiconductor laser driving device according to an embodiment of the present invention and an image forming apparatus having the semiconductor laser driving apparatus, the deterioration of the semiconductor laser is detected based on the bias current setting signal transmitted from the control circuit unit and/or the switching current setting signal, and the deterioration detecting signal indicating the detection result is generated and transmitted. By having this configuration, it becomes possible to accurately detect the deterioration of the semiconductor laser with a smaller circuit size and regardless of the variation of the characteristics of the semiconductor laser and the using conditions of the semiconductor laser by adding a minimum circuit.

Figure 1:
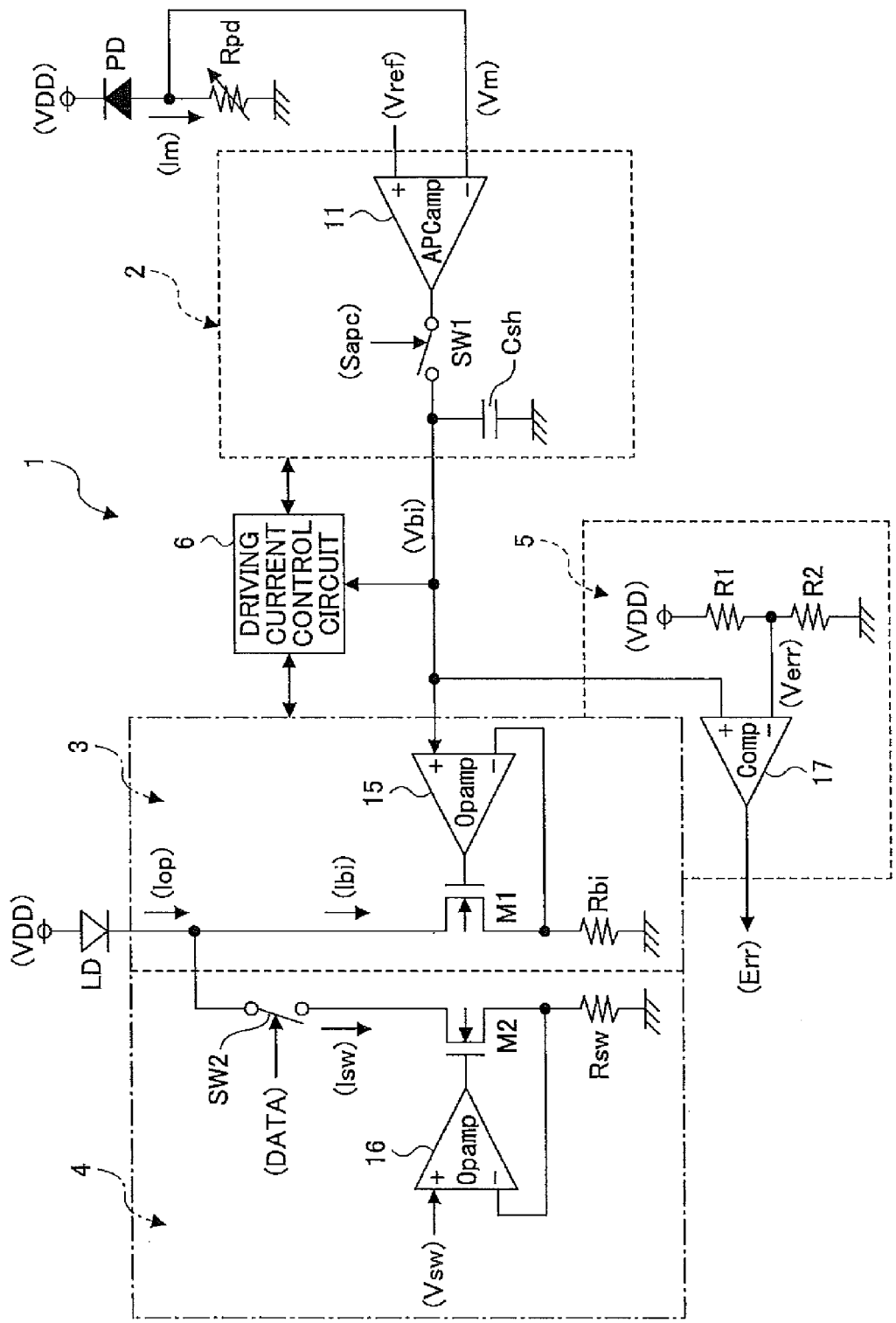
FIG. 1 is an exemplary circuit configuration diagram of a semiconductor laser driving device according to a first embodiment of the present invention.

DESCRIPTION OF THE REFERENCE NUMERALS 1, 1C: SEMICONDUCTOR LASER DRIVING DEVICE
2, 2C: APC CIRCUIT
3, 3C: BIAS CURRENT GENERATING CIRCUIT
4, 4C: SWITCHING CURRENT GENERATING CIRCUIT
5: DETERIORATION DETECTING CIRCUIT
6, 6C: DRIVING CURRENT CONTROL CIRCUIT
11, 11A, 11B, 15, 16, 18: OPERATIONAL AMPLIFIER CIRCUIT
17, 17A, 17B: COMPARATOR
21, 22: A/D CONVERTING CIRCUIT
23, 24: APC LOGIC CIRCUIT
25, 26: REFERENCE CODE SETTING CIRCUIT
31, 32: D/A CONVERTING CIRCUIT
LD: SEMICONDUCTOR LASER
PD: PHOTO DIODE
Rpd: VARIABLE RESISTOR E
RBI: BIAS CURRENT SETTING RESISTOR
Rsw: SWITCHING CURRENT SETTING RESISTOR
R1, R2, R1A, R2A, R1B, R2B: RESISTOR
SW1, SW2, SW1a, SW1b: SWITCH
M1, M2, M3: NMOS TRANSISTOR
Csh, Csha, Cshb: SAMPLE/HOLD CAPACITOR

BEST MODE FOR CARRYING OUT THE INVENTION

Next, embodiments of the present invention are described in detail with reference to the accompanying drawings.

First Embodiment

FIG. 1 is a circuit diagram showing an exemplary configuration of a semiconductor laser driving device according to a first embodiment of the present invention.

The semiconductor laser driving device 1 in FIG. 1 performs control (hereinafter referred to as the APC (Automatic Power Control)) to keep the light amount of the semiconductor laser LD constant in response to the variation of the forward current-optical output characteristics (i-L characteristics) of the semiconductor laser such as a laser diode LD, the variation being caused by, for example, temperature change or deterioration over time. In the semiconductor laser driving device 1, the emitted light amount of the semiconductor laser LD is received by a photo diode PD, and the APC is performed in response to the received light amount. The descriptions herein are made assuming that the semiconductor laser driving device 1 is being used in an image forming apparatus such as a laser printer and a digital copier.

As shown in FIG. 1, the semiconductor laser driving device 1 includes the photo diode PD, a variable resistor Rpd, an APC circuit 2, a bias current generating circuit 3, a switching current generating circuit 4, a deterioration detecting circuit 5 detecting the deterioration of the semiconductor laser LD, a driving current control circuit 6 outputting a setting value of a switching current Isw and setting a driving current value for the semiconductor laser LD. The APC circuit 2 includes an operational amplifier circuit 11, a switch SW1, and a sample/hold capacitor Csh. The bias current generating circuit 3 includes an operational amplifier circuit 15, an NMOS transistor M1, and a bias current setting resistor Rbi. The switching current generating circuit 4 includes an operational amplifier circuit 16, an NMOS transistor M2, a switching current setting resistor Rsw, and a switching current control switch SW2. The deterioration detecting circuit 5 includes a comparator 17 and resistors R1 and R2.

The photo diode PD, the variable resistor Rpd and the APC circuit 2 constitute a control circuit section. The bias current generating circuit 3 constitutes a bias current generating circuit section. The switching current generating circuit 4 constitutes a switching current generating circuit section. The deterioration detecting circuit 5 constitutes a deterioration detecting circuit section. Further, the photo diode PD and the variable resistor Rpd constitute a light amount detecting circuit. The operational amplifier circuit 11 constitutes a first operational amplifier circuit. The switch SW1 and the sample/hold capacitor Csh constitute a first sample/hold circuit. Further, the operational amplifier circuit 15 and the NMOS transistor M1 constitute a first voltage-current converting circuit. The operational amplifier circuit 16 and the NMOS transistor M2 constitute a second voltage-current converting circuit. Further, the deterioration detecting circuit 5 constitutes a first deterioration detecting circuit. The resistors R1 and R2 constitute a first voltage generating circuit. The comparator 17 constitutes a first voltage comparison circuit. Further, the APC circuit 2, the bias current generating circuit 3, the switching current generating circuit 4, the deterioration detecting circuit 5, and the driving current control circuit 6 may be integrated together into a single IC.

Further, as shown in FIG. 1, the cathode of the photo diode PD is connected to a voltage source VDD, and the variable resistor Rpd is connected between the anode of the photo diode PD and ground potential. The connecting point between the photo diode PD and the variable resistor Rpd is connected to the inverting input terminal of the operational amplifier circuit 11. A predetermined reference voltage is applied to the non-inverting input terminal of the operational amplifier circuit 11. The output terminal of the operational amplifier circuit 11 is connected to one end of the switch SW1. The sample/hold capacitor Csh is connected between the other end of the switch SW1 and ground potential. The connecting point between the switch SW1 and the sample/hold capacitor Csh is connected to the non-inverting input terminals of the operational amplifier circuit 15 and the comparator 17. An external APC signal Sapc with respect to a control electrode indicating whether the APC is performed is input to the switch SW1.

Further, the anode of the semiconductor laser LD is connected to the voltage source VDD, and the cathode of the semiconductor laser LD is connected to the drain of the NMOS transistor M1, and is also connected to the drain of the NMOS transistor M2 through the switching current control switch SW2. The bias current setting resistor Rbi is connected between the source of the NMOS transistor M1 and ground potential. The inverting input terminal of the operational amplifier circuit 15 is connected to the source of the NMOS transistor M1, and the output terminal of the operational amplifier circuit 15 is connected to the gate of the NMOS transistor M1. An external image data signal DATA with respect to the control electrode is input to the switch SW2.

Further, the switching current setting resistor Rsw is connected between the source of the NMOS transistor M2 and ground potential. A switching current setting voltage Vsw from the driving current control circuit 6 is applied to the non-inverting input terminal of the operational amplifier circuit 16. The inverting input terminal of the operational amplifier circuit 16 is connected to the source of the NMOS transistor M2, and the output terminal of the operational amplifier circuit 16 is connected to the gate of the NMOS transistor M2. On the other hand, the resistors R1 and R2 are connected in series between the voltage source VDD and ground potential. The connecting point between the resistors R1 and R2 is connected to the inverting input terminal of the comparator 17. The comparator 17 outputs a deterioration detecting signal Err indicating whether the deterioration of the semiconductor laser LD is being detected.

By having the above configuration, the light emitted from the semiconductor laser LD is received by the photo diode PD, and the photo diode PD generates the monitor current Im in accordance with the received light amount. The monitor current Im is converted into a voltage by the variable resistor Rpd. The converted voltage is applied as a monitoring voltage Vm to the inverting input terminal of the operational amplifier circuit 11. The operational amplifier circuit 11 amplifies and outputs the voltage difference between the applied monitoring voltage Vm and a predetermined reference voltage Vref. The switch SW1 is turned ON (makes the circuit) when the external APC signal Sapc indicating that the APC is being performed is input to the switch SW1. On the other hand, the switch SW1 is turned OFF (cuts off the circuit) when the external APC signal Sapc indicating that the APC is stopped is input to the switch SW1.

When the APC is being performed, the switch SW1 is turned ON (makes the circuit) and accordingly, the sample/hold capacitor Csh is charged by the output voltage of the operational amplifier circuit 11. Namely, in response to the switching operation of the switch SW1, the output voltage of the operational amplifier circuit 11 is sampled and held by the sample/hold capacitor Csh. When the APC is being performed, the output voltage of the operational amplifier circuit 11 is applied as a bias current setting voltage Vbi to the non-inverting input terminals of the operational amplifier circuit 15 and the comparator 17. The operational amplifier circuit 15 controls the operation of the NMOS transistor M1 so that the voltage at the connecting point between the NMOS transistor M1 and the bias current setting resistor Rbi is substantially equal to the bias current setting voltage Vbi, and converts the bias current setting voltage Vbi into a current.

The switch SW2 is turned ON and OFF in response to the image data signal DATA input with respect to the control electrode. The operational amplifier circuit 16 controls the operation of the NMOS transistor M2 so that the voltage at the connecting point between the NMOS transistor M2 and the switching current setting resistor Rsw is substantially equal to the switching current setting voltage Vsw, and converts the switching current setting voltage Vsw into a current. A bias current Ibi and a switching current Isw flow through the semiconductor laser LD. The bias current Ibi is the current flowing through the circuit in which the NMOS transistor M1 and the bias current setting resistor Rbi are connected in series. The switching current Isw is a current flowing through the circuit in which the NMOS transistor M2 and the switching current setting resistor Rsw are connected in series, the current flowing when the switch SW2 is turned ON in response to the image data signal DATA. As described above, the previously set switching current Isw is added to the bias current Ibi to form a driving current Iop, so that that the formed driving current Iop is applied to the semiconductor laser LD to obtain the predetermined light amount from the semiconductor laser LD, and the APC is thus performed.

Further, when the APC is not being performed, the switch SW1 is turned OFF (cuts off the circuit) in response to the external APC signal Sapc, and the voltage drop across the sample/hold capacitor Csh is the bias current setting voltage Vbi. In this case, preferably, the APC is being performed so that the bias current Ib follows a threshold value current Ith of the semiconductor laser LD and the bias current Ibi is less than the threshold value current Ith.

The switching current setting voltage Vsw may be externally input, and in that case, the driving current control circuit 6 may be removed. However, the driving current control circuit 6 may determine the characteristics, especially the threshold value current Ith, of each semiconductor laser LD based on the bias current Ibi and the bias current setting voltage Vbi which is the output voltage of the APC circuit 2, so that the most appropriate initial value of the switching current Isw can be set. Such a setting of the switching current setting voltage Vsw can be done by a method disclosed in, for example, Japanese Laid-Open Patent Application No. 2007-73543 and Japanese Patent No. 3466599.

In the deterioration detecting circuit 5, a reference voltage Verr is applied to the inverting input terminal of the comparator 17. The reference voltage Verr is generated as the divided voltage of the voltage source VDD by the resistors R1 and R2 and is used to determine whether the semiconductor laser LD is deteriorated. In FIG. 1, the reference voltage Verr constitutes a first voltage. As the reference voltage Verr, a voltage corresponding to a current value Ierr is set. The current value Ierr is determined by subtracting the switching current Isw from either a driving maximum current Imax described on the data sheet of each semiconductor laser LD or a maximum driving current Iopmax corresponding to the maximum light amount value that the user uses. By doing this, it may become possible to detect the deterioration of the semiconductor laser LD just after the deterioration process of the semiconductor laser LD starts and before the semiconductor laser LD malfunctions. More specifically, it may become possible to accurately detect the deterioration of the semiconductor laser LD by adding a circuit capable of reporting that the semiconductor laser LD has deteriorated in response to the input of the high-level of the deterioration detecting signal Err transmitted from the comparator 17 when the bias current setting voltage Vbi is greater than the reference voltage Verr.

Figure 2:
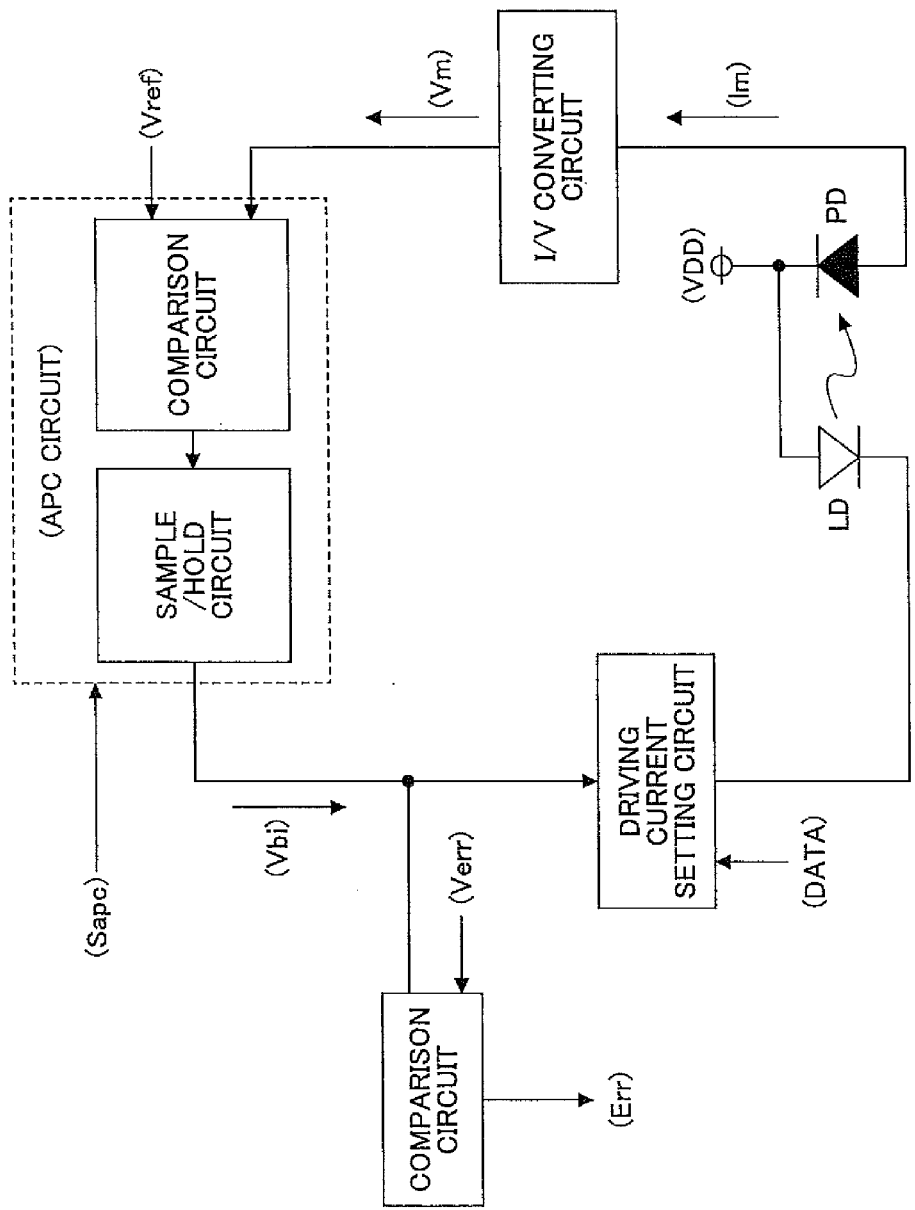
FIG. 2 is a schematic block diagram of the semiconductor laser driving device 1 in FIG. 1.
Figure 18:
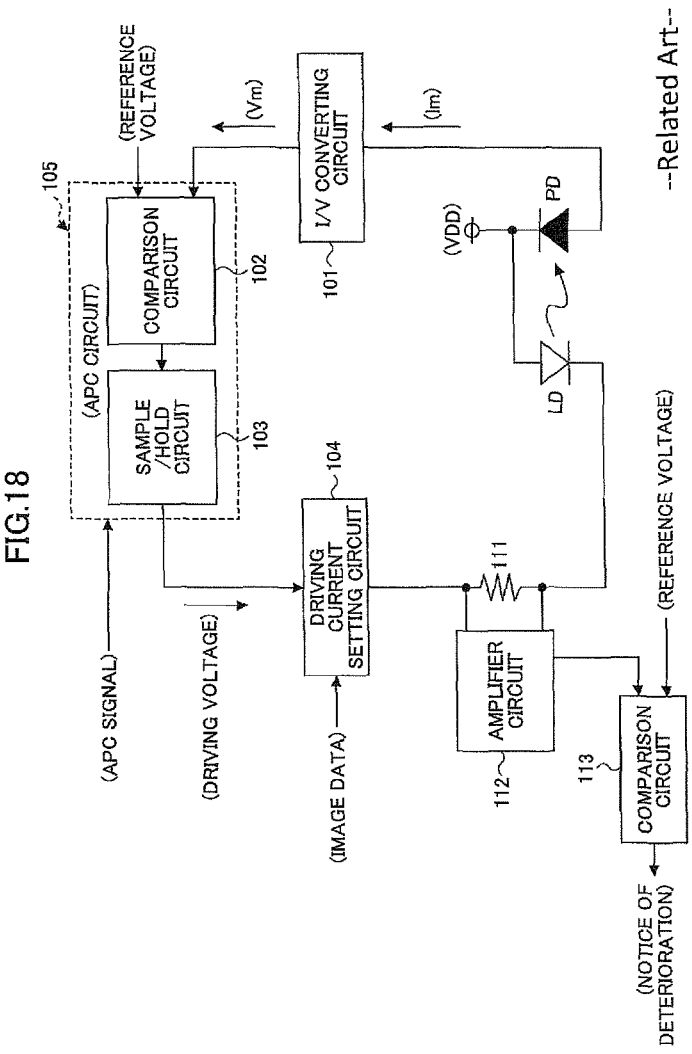
FIG. 18 is a schematic block diagram of another conventional semiconductor laser driving device.

FIG. 2 is a schematic block diagram of the semiconductor laser driving device 1 in FIG. 1. When compared with the block diagram of FIG. 18 showing a conventional semiconductor laser driving device, the circuit size of the semiconductor laser driving device 1 is smaller than that of the conventional semiconductor laser driving device, and further, the semiconductor laser driving device 1 may not be directly affected by the parasitic capacitance and the input leakage current. In FIG. 2, the I/V converting circuit corresponds to the variable resistor Rpd. The comparison circuit of the APC circuit corresponds to the operational amplifier circuit 11 in FIG. 1. The sample/hold circuit of the APC circuit corresponds to the switch SW1 and the sample/hold capacitor Csh. Further, the driving current setting circuit in FIG. 2 corresponds to the bias current generating circuit 3 and the switching current generating circuit 4 in FIG. 1.

Further, according to the embodiment of the present invention, it may become possible to accurately detect the deterioration of the semiconductor laser LD by setting the resistance value rbi of the bias current setting resistor Rbi so that the following formula (I) is satisfied:

$$Iop\max(\text{or } I\max) - Isw = Ibi\max \approx Verr/rbi(=Ierr) \tag{1}$$

Figure 3:
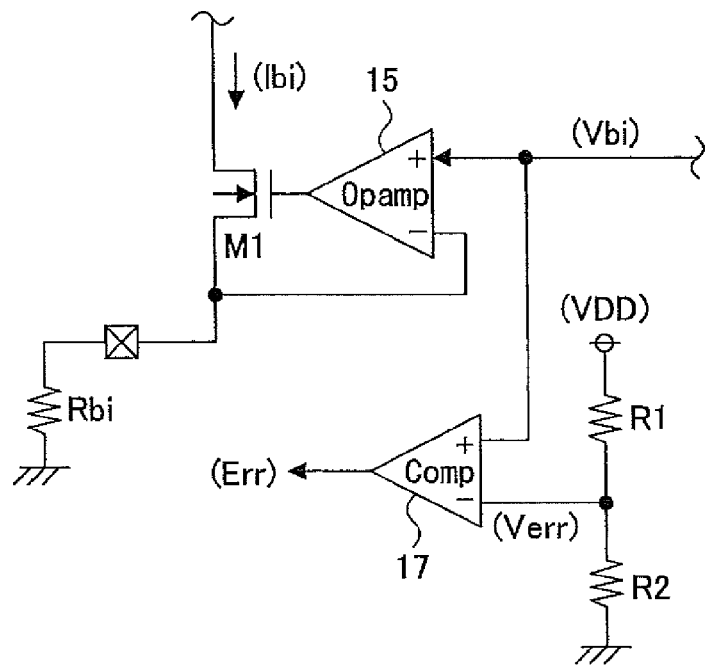
FIG. 3 is another example of the semiconductor laser driving device according to the first embodiment of the present invention.
Figure 4:
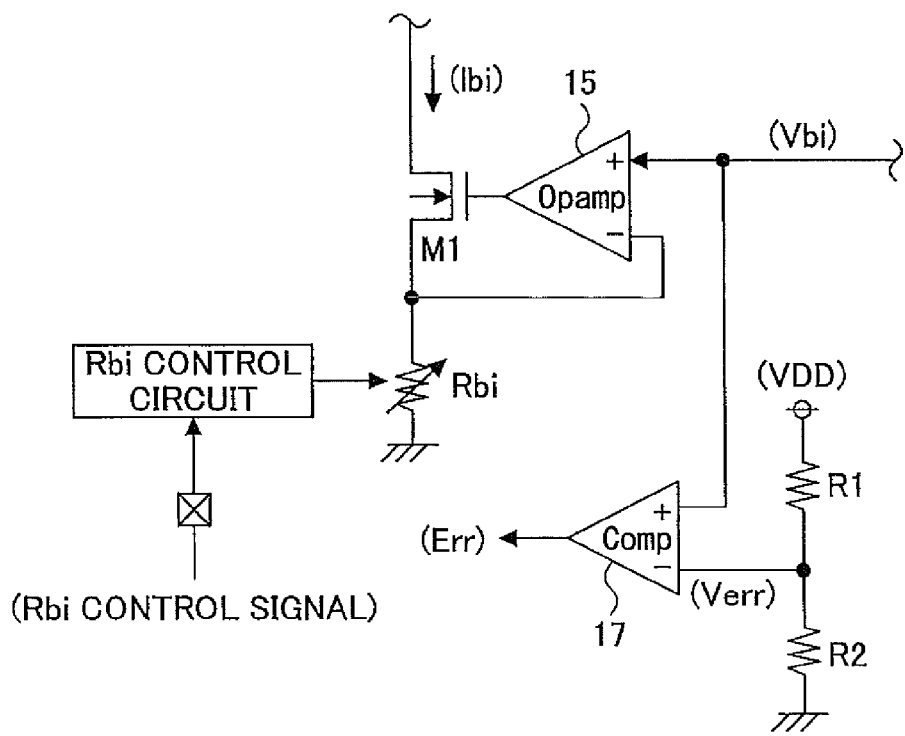
FIG. 4 is still another example of the semiconductor laser driving device according to the first embodiment of the present invention.

Further, as shown in FIG. 3, the bias current setting resistor Rbi may be disposed outside an IC in which all the circuits of the semiconductor laser driving device 1 excluding the photo diode PD and the variable resistor Rpd are integrated, so that the user can set an arbitrary value in the bias current setting resistor Rbi. Further, as shown in FIG. 4, the resistance value rbi of the bias current setting resistor Rbi may be selected in response to an externally applied Rbi control signal. In any case, it may become possible to set the resistance value rbi of the bias current setting resistor Rbi in accordance with the characteristics of the semiconductor laser LD to be used.

Figure 5:
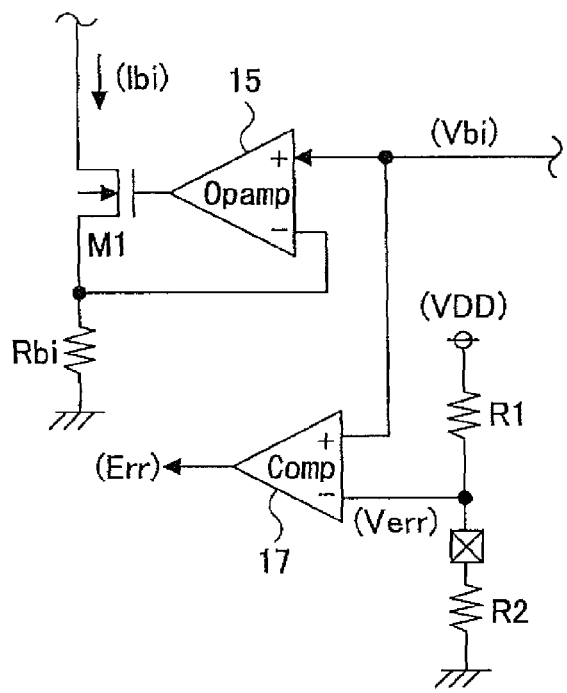
FIG. 5 is still another example of the semiconductor laser driving device according to the first embodiment of the present invention.
Figure 6:
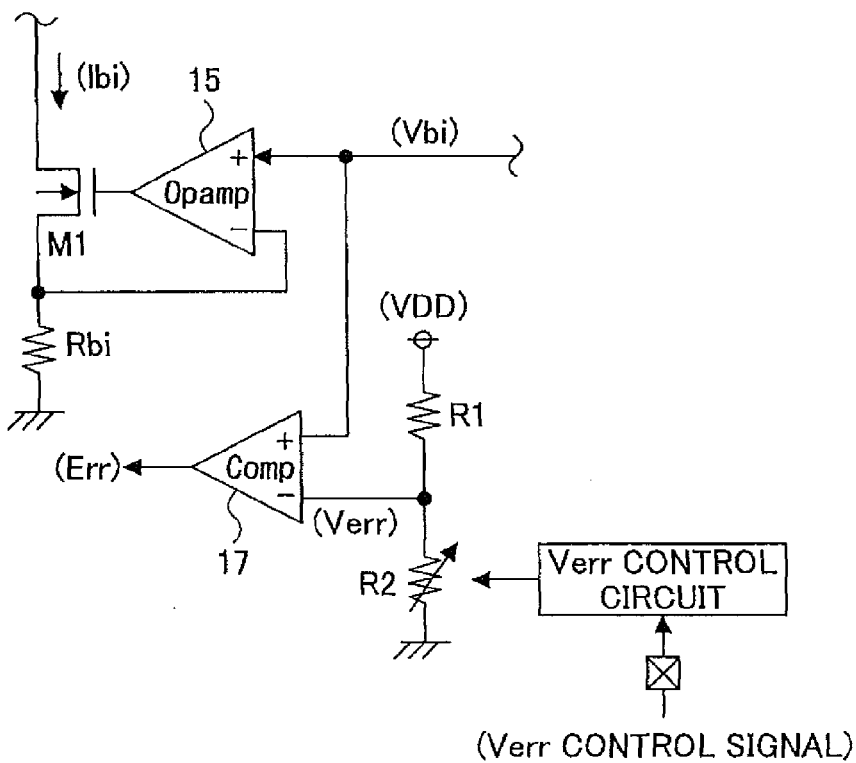
FIG. 6 is still another example of the semiconductor laser driving device according to the first embodiment of the present invention.
Figure 7:
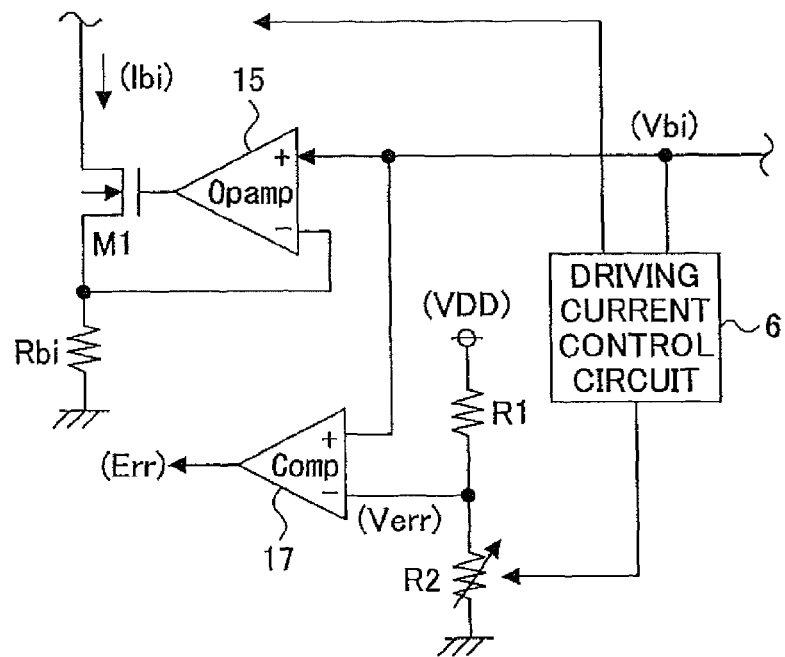
FIG. 7 is still another example of the semiconductor laser driving device according to the first embodiment of the present invention.

In the same manner, as shown in FIG. 5, the resistor R2 may be disposed outside an IC in which all the circuits of the semiconductor laser driving device 1 excluding the photo diode PD and the variable resistor Rpd are integrated, so that the user can set an arbitrary value for the resistor R2. Further, as shown in FIG. 6, the resistor R2 may be configured so that the resistance value of the resistor R2 can be selected in response to an externally applied Verr control signal. Further, as shown in FIG. 7, the resistor R2 may be configured so that the resistance value of the resistor R2 can be set in response to the data (information) transmitted from the driving current control circuit 6. In any case, even when the resistance value rbi of the bias current setting resistor Rbi is fixed, it may still be possible to accurately detect the deterioration of the semiconductor laser LD by setting the reference voltage Verr in response to the semiconductor laser LD so that the above formula (1) is satisfied.

Figure 8:
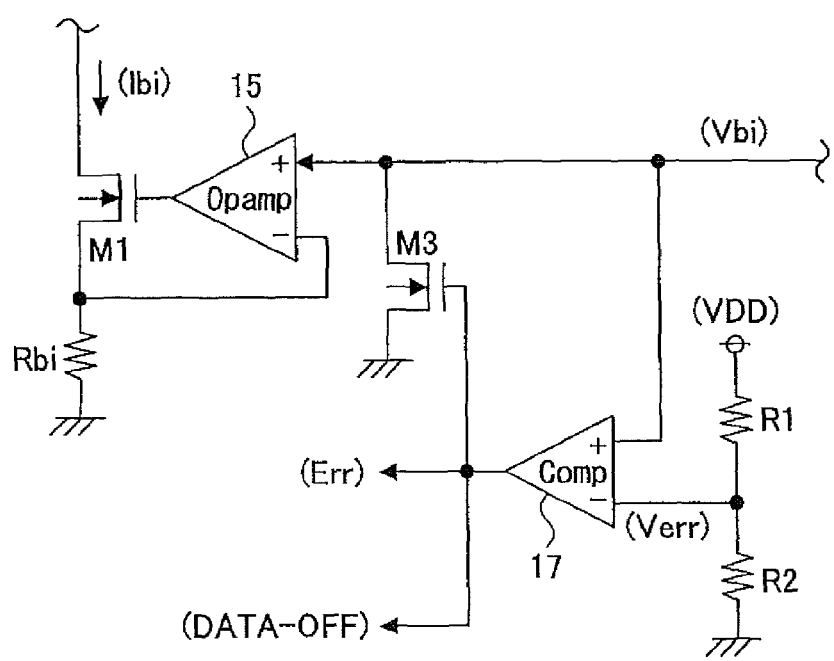
FIG. 8 is still another example of the semiconductor laser driving device according to the first embodiment of the present invention.
Figure 9:
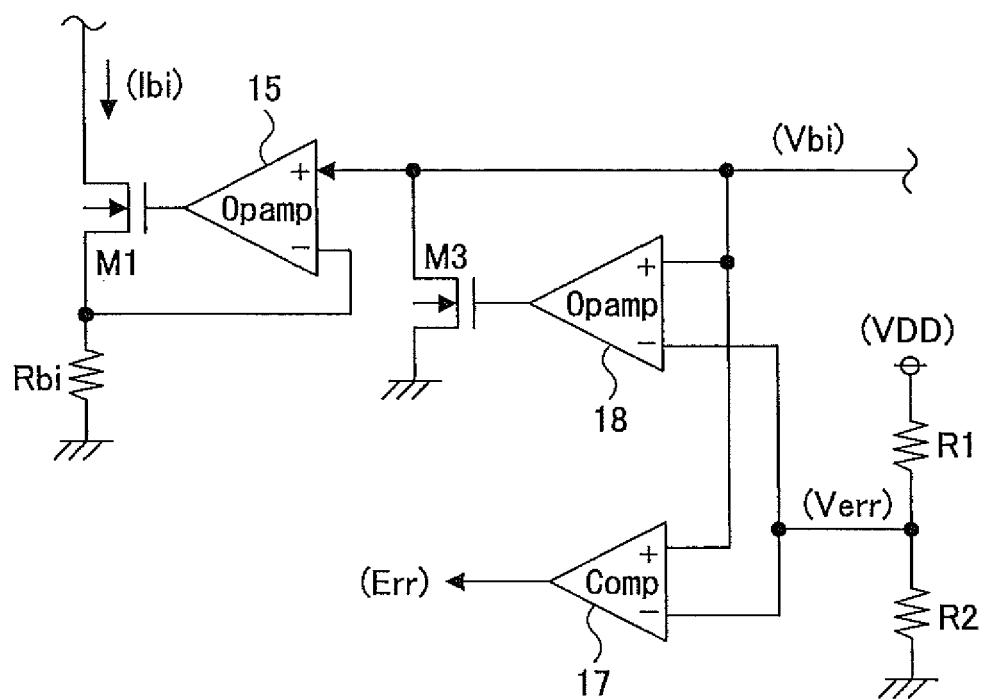
FIG. 9 is still another example of the semiconductor laser driving device according to the first embodiment of the present invention.

Further, as shown in FIG. 8, an NMOS transistor M3 may be added to the deterioration detecting circuit 5 in FIG. 1. By having this, when the high-level of the deterioration detecting signal Err is transmitted from the comparator 17, the deterioration detecting signal Err indicating that the deterioration of the semiconductor laser LD is detected, the input of the image data signal DATA to the switch SW2 is interrupted so that the switch SW2 is turned OFF (cut off the switch) and the NMOS transistor M2 is turned ON (making the NMOS transistor M2 conductive) so that the bias current setting voltage Vbi is connected to ground potential. Further, as shown in FIG. 9, an operational amplifier circuit 18 may be provided in addition to the comparator 17, so that the operation of the NMOS transistor M3 is controlled in response to the output signal from the operational amplifier circuit 18.

In this case, a voltage greater than the reference voltage Verr may be input to the inverting input terminal of the operational amplifier circuit 18, so that the bias current setting voltage Vbi may be limited by using a voltage other than the reference voltage Verr. By having the configurations in FIGS. 8 and 9, it may become possible to protect against the further deterioration of the semiconductor laser LD by stopping the supply of the bias current Ibi when the deterioration of the semiconductor laser LD is detected. Further, by having the configurations in FIGS. 8 and 9, it may become possible not only to detect the deterioration of the semiconductor laser LD but also to avoid a continuous abnormal increase of the current flowing through the semiconductor laser LD due to a short-circuit in the photo diode PD caused by not a problem in the semiconductor laser LD but the improper installation of the semiconductor laser LD.

Figure 10:
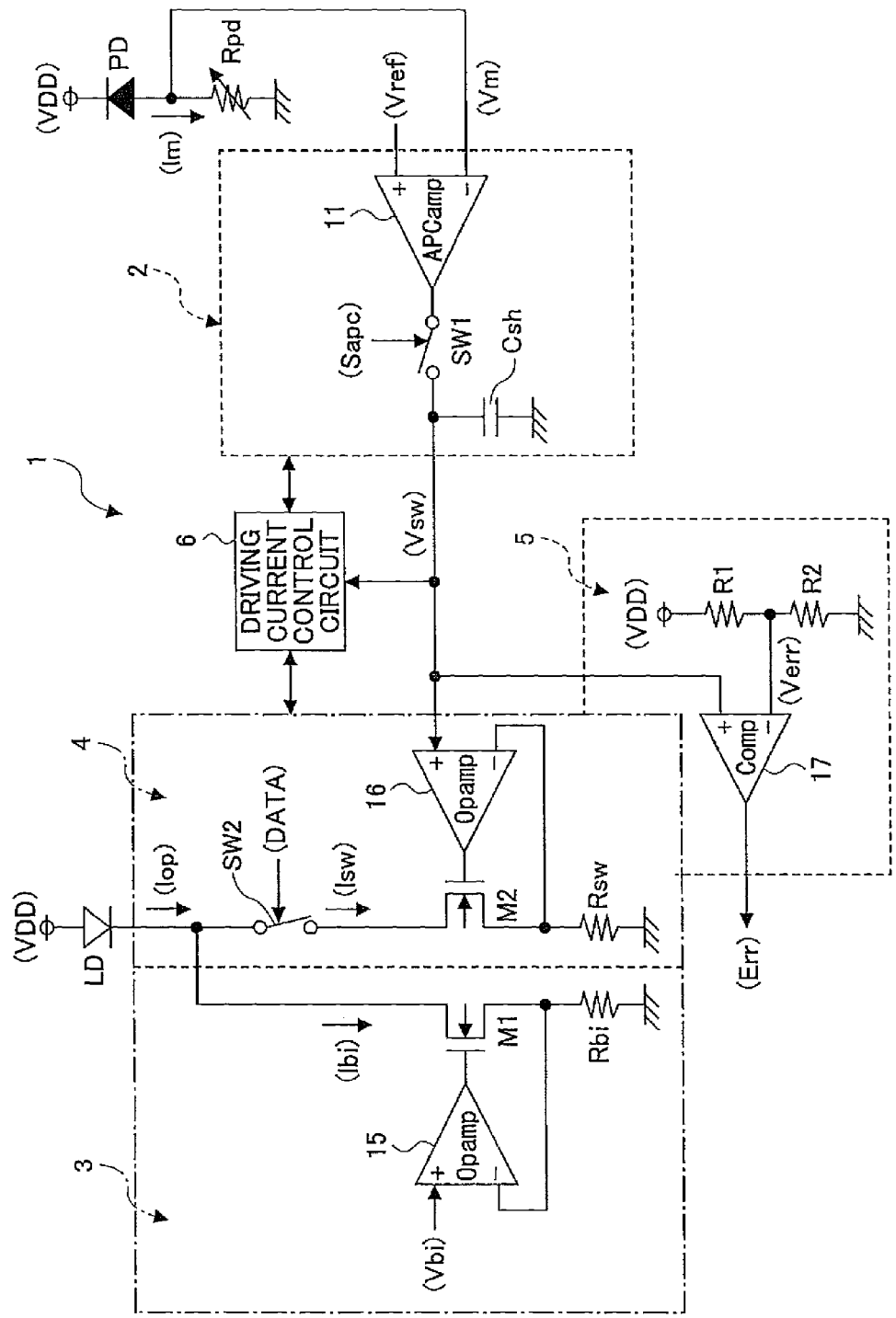
FIG. 10 is still another example of the semiconductor laser driving device according to the first embodiment of the present invention.

In the configuration of FIG. 1, the APC is performed with respect to the bias current Ibi while the value of the switching current Isw is fixed. However, the APC may be performed with respect to the switching current Isw while the value of the bias current Ibi is fixed. In this case, the circuit configuration of the semiconductor laser LD changes from that of FIG. 1 to that of FIG. 10. In FIG. 10, the same reference numerals and symbols are commonly used for the same or equivalent elements in FIG. 1. Points of difference in configurations between FIG. 10 and FIG. 1 are that in FIG. 10, the output voltage of the APC circuit 2 is the switching current setting voltage Vsw, the bias current setting voltage Vbi is configured so that the bias current setting voltage Vbi is output from the driving current control circuit 6 or is externally input, and the high-level of the deterioration detecting signal Err is output from the comparator 17 when the switching current setting voltage Vsw is greater than the reference voltage Verr, so that it may become possible to detect the deterioration of the semiconductor laser LD by adding a circuit capable of indicating the deterioration of the semiconductor laser LD in response to the output of the high-level of the deterioration detecting signal Err from the comparator 17.

By having the configuration, it may become possible to easily and accurately detect the deterioration of the semiconductor laser LD. Further, in the configuration of FIG. 10, the bias current setting voltage Vbi may be externally input. In this case, the driving current control circuit 6 may be removed. However, the driving current control circuit 6 may determine the characteristics, especially the threshold value current Ith, of each semiconductor laser LD based on the switching current Isw and the switching current setting voltage Vsw which is the output voltage of the APC circuit 2, so that the most appropriate initial value of the bias current Ibi can be set. In FIG. 10, the operational amplifier circuit 11 constitutes a second operational amplifier circuit. The switch SW1 and the sample/hold capacitor Csh constitute a second sample/hold circuit. The reference voltage Verr constitutes a second voltage. The resistors R1 and R2 constitute a second voltage generating circuit. The comparator 17 constitutes a second voltage comparison circuit.

In the configuration of FIG. 1, the APC is performed with respect to the bias current Ibi while the value of the switching current Isw is fixed. However, the APC may be performed with respect to both the switching current Isw and the bias current Ibi. In this case, the circuit configuration of the semiconductor laser LD changes from that of FIG. 1 to that of FIG. 11. In the deterioration detecting circuit 5 of FIG. 11, when at least one of the bias current setting voltage Vbi and the switching current setting voltage Vsw is greater than the corresponding reference voltages Verr1 and Verr2, respectively, the comparator 17a and/or comparator 17b outputs the high-level of the deterioration detecting signal Err1 and/or deterioration detecting signal Err2, so that it may become possible to easily and accurately detect the deterioration of the semiconductor laser LD by adding a circuit capable of reporting the deterioration of the semiconductor laser LD in response to the output of the high-level of the deterioration detecting signal Err1 and/or deterioration detecting signal Err2.

Figure 11:
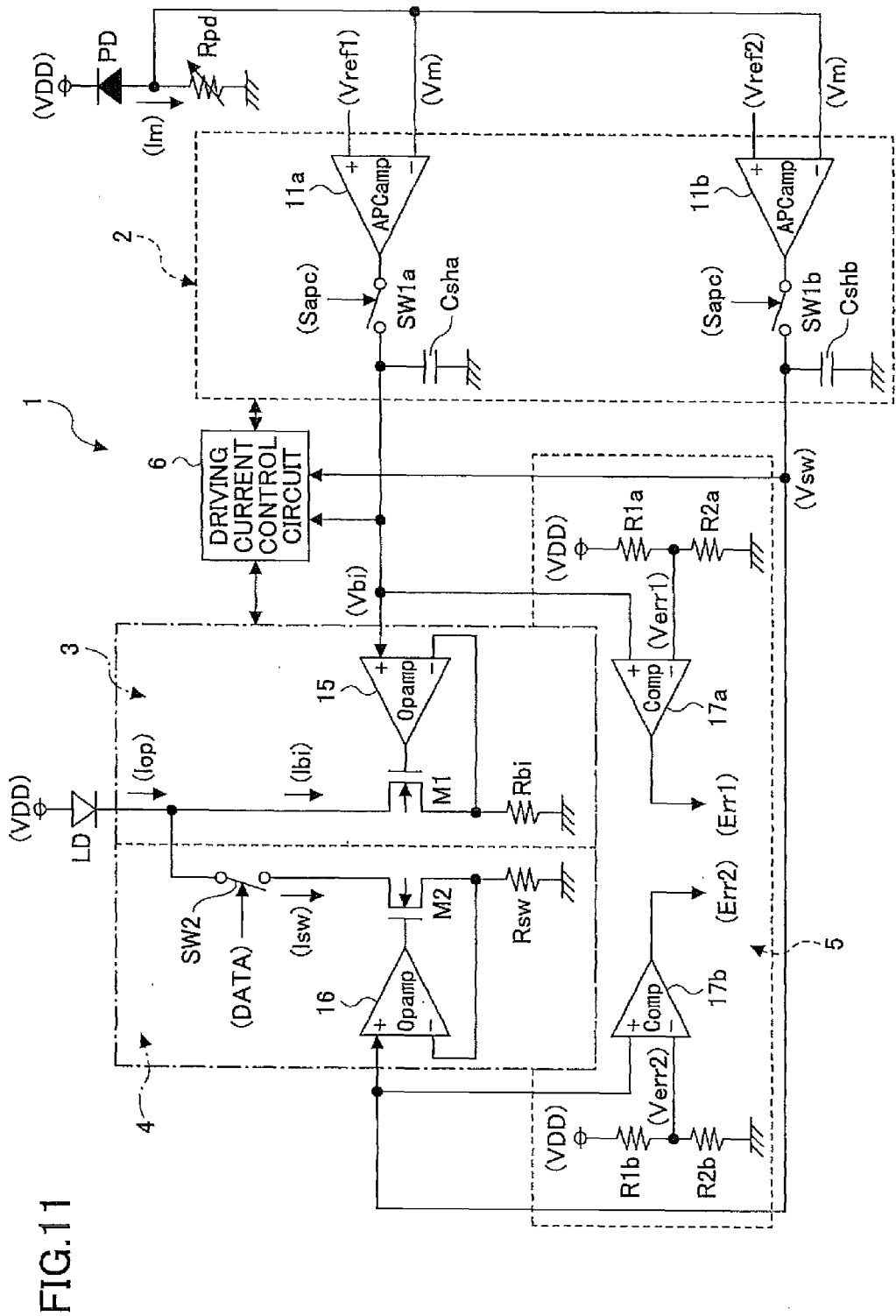
FIG. 11 is still another example of the semiconductor laser driving device according to the first embodiment of the present invention.

In the configuration of FIG. 11, the operational amplifier circuit 11a constitutes a first operational amplifier circuit. The switch SW1a and the sample/hold capacitor Csha constitute a first sample/hold circuit. Further, the operational amplifier circuit 11b constitutes a second operational amplifier circuit. The switch SW1b and the sample/hold capacitor Cshb constitute a second sample/hold circuit. The reference voltages Verr1 and Verr2 constitute a first voltage and a second voltage, respectively. The resistors R1a and R2a constitute a first voltage generating circuit. The resistors R1b and R2b constitute a second voltage generating circuit. The comparator 17a constitutes a first voltage comparison circuit. The comparator 17b constitutes a second voltage comparison circuit.

As described above, in the semiconductor laser driving device according to the first embodiment of the present invention, when the bias current setting voltage Vbi transmitted from the APC circuit 2 and/or the switching current setting voltage Vsw is greater than the corresponding predetermined voltage, the deterioration detecting circuit 5 determines that the semiconductor laser LD is deteriorated, and outputs the deterioration detecting signal indicating that the semiconductor laser LD is deteriorated. By having this configuration, it may become possible to accurately detect the deterioration of the semiconductor laser LD with a smaller circuit size and regardless of the variation of the characteristics of the semiconductor laser and the using conditions of the semiconductor laser by adding a minimum circuit.

Second Embodiment

In the above first embodiment, a case is described where the semiconductor laser driving device 1 is realized by analog circuits. However, digital circuits along with current-output-type D/A (digital-to-analog) converters may be used. Next, a semiconductor laser driving device 1c having digital circuits according to a second embodiment of the present invention is described.

Figure 12:
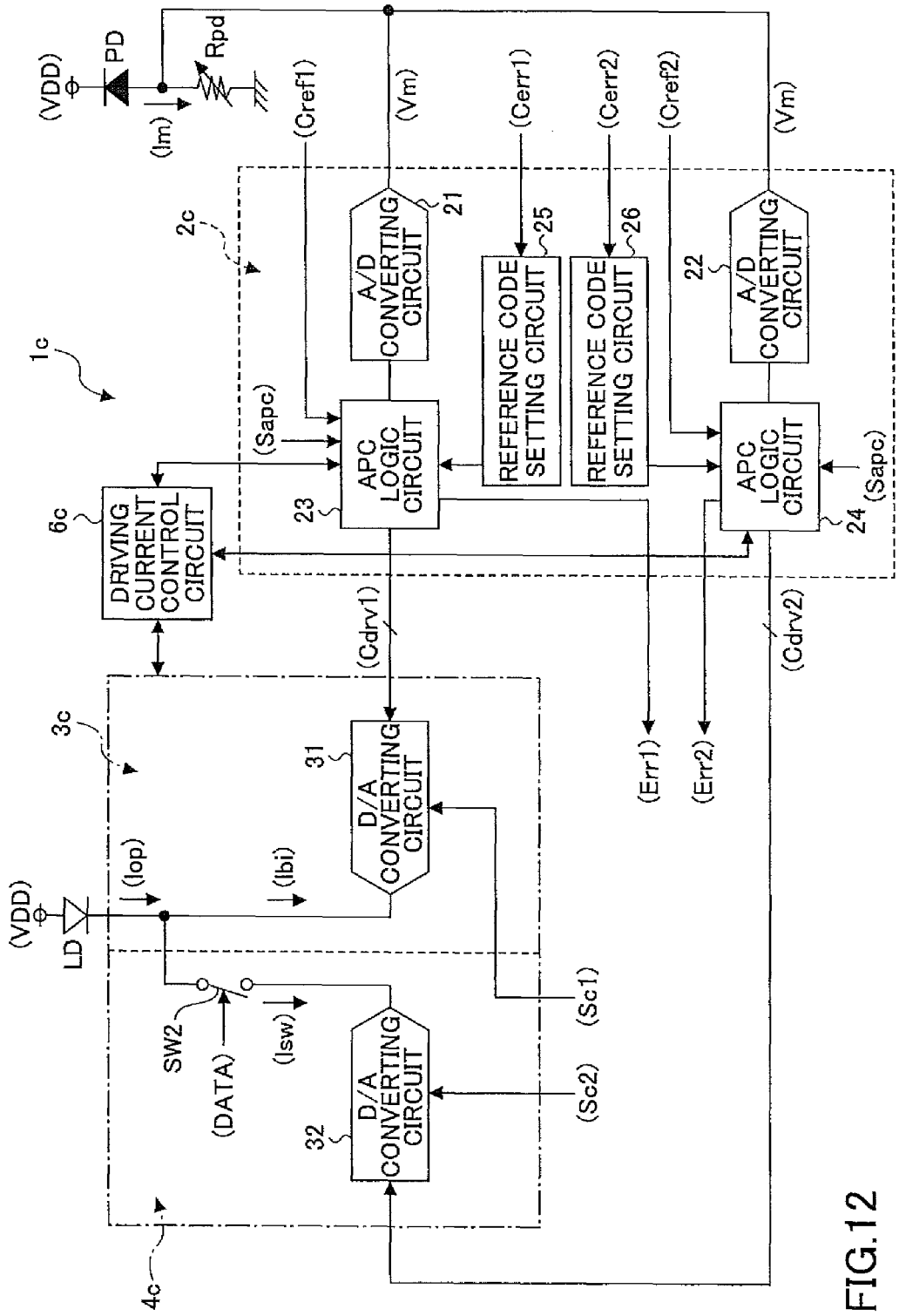
FIG. 12 is an exemplary circuit configuration diagram of a semiconductor laser driving device according to a second embodiment of the present invention.

FIG. 12 is an exemplary circuit configuration diagram of the semiconductor laser driving device 1c according to the second embodiment of the present invention. The same reference numerals in FIG. 12 denote the same or similar elements in FIG. 1. FIG. 12 shows a case where the APC is performed with respect to both the bias current Ibi and the switching current Isw.

In the semiconductor laser driving device 1c of FIG. 12, the emitted light amount of the semiconductor laser LD is received by the photo diode PD, and the APC is performed in response to the received light amount.

As shown in FIG. 12, the semiconductor laser driving device 1c includes the photo diode PD, the variable resistor Rpd, an APC circuit 2c, a bias current generating circuit 3c, a switching current generating circuit 4c, and a driving current control circuit 6c. The APC circuit 2c includes A/D converting circuits 21 and 22, APC logic circuits 23 and 24, and reference code setting circuits 25 and 26. The bias current generating circuit 3c includes a current output type D/A converting circuit 31. The switching current generating circuit 4c includes a current output type D/A converting circuit 32 and the switching current control switch SW2.

The cathode of the photo diode PD is connected to the voltage source VDD, and the variable resistor Rpd is connected between the anode of the photo diode PD and ground potential. The connecting point between the photo diode PD and the variable resistor Rpd is connected to the input terminals of the A/D converting circuits 21 and 22. The output terminal of the A/D converting circuit 21 is connected to the input terminal of the APC logic circuit 23. In the same manner, the output terminal of the A/D converting circuit 22 is connected to the input terminal of the APC logic circuit 24. A reference code Cerr1 is externally set in the reference code setting circuit 25, the reference code Cerr1 being a criterion used to determine whether the semiconductor laser LD is deteriorated. In the same manner, a reference code Cerr2 is externally set in the reference code setting circuit 26, the reference code Cerr2 being a criterion used to determine whether the semiconductor laser LD is deteriorated. The reference code Cerr1 set in the reference code setting circuit 25 is output to the APC logic circuit 23. In the same manner, the reference code Cerr2 set to the reference code setting circuit 25 is output to the APC logic circuit 24.

The APC signal Sapc is externally input to each of the APC logic circuits 23 and 24 and, in response to the signals, the reference codes Cerr1 and Cerr2 are input to the APC logic circuits 23 and 24, respectively. The APC logic circuit 23 generates a driving code Cdrv1 and outputs the driving code Cdrv1 to the current output type D/A converting circuit 31. In the same manner, the APC logic circuit 24 generates a driving code Cdrv2 and outputs the driving code Cdrv2 to the current output type D/A converting circuit 32. The deterioration detecting signals Err1 and Err2 are output from APC logic circuits 23 and 24, respectively each of the deterioration detecting signals Err1 and Err2 indicating whether the deterioration of the semiconductor laser LD is detected. Further, in response to the deterioration detecting signals Err1 and Err2, control signals Sc1 and Sc2 for limiting the maximum output current of the semiconductor laser LD are externally input to the current output type D/A converting circuits 31 and 32, respectively. The anode of the semiconductor laser LD is connected to the voltage source VDD. The cathode of the semiconductor laser LD is connected to the output terminal of the current-output-type D/A converting circuit 32 through the switching current control switch SW2 and the output terminal of the current-output-type D/A converting circuit 31.

In FIG. 12, the photo diode PD, the variable resistor Rpd, the A/D converting circuits 21 and 22, and the APC logic circuits 23 and 24 constitute the control circuit section. The bias current generating circuit 3c constitutes the bias current generating circuit section. The switching current generating circuit 4c constitutes the switching current generating circuit section. Further, the A/D converting circuit 21 and the APC logic circuit 23 constitute a first driving code generating section, and the driving code Cdrv1 constitutes a first driving code. In the same manner, the A/D converting circuit 22 and the APC logic circuit 24 constitute a second driving code generating section, and the driving code Cdrv2 constitutes a second driving code. Further, the APC logic circuits 23 and 24 and the reference code setting circuits 25 and 26 constitute the deterioration detecting circuit section. The current-output-type D/A converting circuit 31 constitutes a first D/A converting circuit, and the current-output-type D/A converting circuit 32 constitutes a second D/A converting circuit. Further, the APC circuit 2c, the bias current generating circuit 3c, the switching current generating circuit 4c, and the driving current control circuit 6c may be integrated together into a single IC.

By having this configuration, the light emitted from the semiconductor laser LD is received by the photo diode PD, and the photo diode PD generates the monitor current Im in accordance with the received light amount. The monitor current Im is converted into a voltage by the variable resistor Rpd. The converted voltage is applied as a monitoring voltage Vm to the A/D converting circuits 21 and 22. The A/D converting circuits 21 and 22 convert the input monitoring voltage Vm from analog to digital to generate digital codes and transmit the generated digital codes to the APC logic circuits 23 and 24, respectively. Upon receiving the APC signal Sapc indicating that the APC is activated, the APC logic circuit 23 compares the transmitted digital code with a reference code Cref1, generates the driving code Cdrv1, and transmits the generated driving code Cdrv1 to the current-output-type D/A converting circuit 31. The driving code Cdrv1 corresponds to a digital code of the bias current setting voltage Vbi in, for example, FIG. 11.

In the same manner, upon receiving the APC signal Sapc indicating that the APC is activated, the APC logic circuit 24 compares the transmitted digital code with a reference code Cref2, generates the driving code Cdrv2, and transmits the generated driving code Cdrv2 to the current output type D/A converting circuit 32. The driving code Cdrv1 corresponds to a digital code of the switching current setting voltage Vsw in, for example, FIG. 11.

The current-output-type D/A converting circuit 31 generates the bias current Ibi in accordance with the transmitted driving code Cdrv1, supplies the generated bias current Ibi to the semiconductor laser LD. On the other hand, the current output type D/A converting circuit 32 generates the switching current Isw in accordance with the transmitted driving code Cdrv2. The switching current control switch SW2 is turned ON and OFF in response to the image data signal DATA input with respect to the control electrode. When the switch SW2 is turned ON to make the circuit, the switching current Isw generated by the D/A converting circuit 32 is supplied to the semiconductor laser LD. On the other hand, when the switch SW2 is turned OFF to cut off the circuit, the supply of the switching current Isw generated by the D/A converting circuit 32 to the semiconductor laser LD is cut off.

By doing this, in a case where the APC is performed, when the switch SW2 is turned ON by the image data signal DATA, the switching current Isw in addition to the bias current Ibi flows through the semiconductor laser LD. Therefore, the APC is performed so that the switching current Isw and the bias current Ibi are combined to form the driving current Iop to be supplied to the semiconductor laser LD to obtain the predetermined light amount from the semiconductor laser LD. On the other hand upon receiving the APC signal Sapc indicating that the APC is deactivated, the APC logic circuit 23 generates and transmits the driving code Cdrv1 so that the generated bias current Ibi is less than the threshold value current Ith of the semiconductor laser LD, and the APC logic circuit 24 stops transmitting the driving code Cdrv2 so that the generation of the switching current Isw is stopped.

Further, the APC logic circuits 23 and 24 also perform the operation of the deterioration detecting circuit. More specifically, the APC logic circuit 23 determines whether the semiconductor laser LD is deteriorated by comparing the reference code Cerr1 set in the reference code setting circuit 25 in advance with the generated driving code Cdrv1. When the value of the bias current Ibi indicated by the driving code Cdrv1 is greater than the value of the current indicated by the reference code Cerr1, the APC logic circuit 23 determines that the semiconductor laser LD is deteriorated and outputs a predetermined deterioration detecting signal Err1 indicating that the deterioration of the semiconductor laser LD is detected. In the same manner, the APC logic circuit 24 determines whether the semiconductor laser LD is deteriorated by comparing the reference code Cerr2 set in the reference code setting circuit 26 in advance with the digital code transmitted from the A/D converting circuit 22. When the value of the switching current Isw indicated by the driving code Cdrv2 is greater than the value of the current indicated by the reference code Cerr2, the APC logic circuit 24 determines that the semiconductor laser LD is deteriorated and outputs a predetermined deterioration detecting signal Err2 indicating that the deterioration of the semiconductor laser LD is detected.

In the embodiment of FIG. 12, the APC is performed with respect to both the bias current Ibi and the switching current Isw. However, the APC may be performed with respect to only one of the bias current Ibi and the switching current Isw. Further, in the embodiment of FIG. 12, the deterioration of the semiconductor laser LD is detected based on both of the driving codes Cdrv1 and Cdrv2. However, as described in the first embodiment of the present invention, the deterioration of the semiconductor laser LD may be detected based on only one of the driving codes Cdrv1 and Cdrv2.

Figure 13:
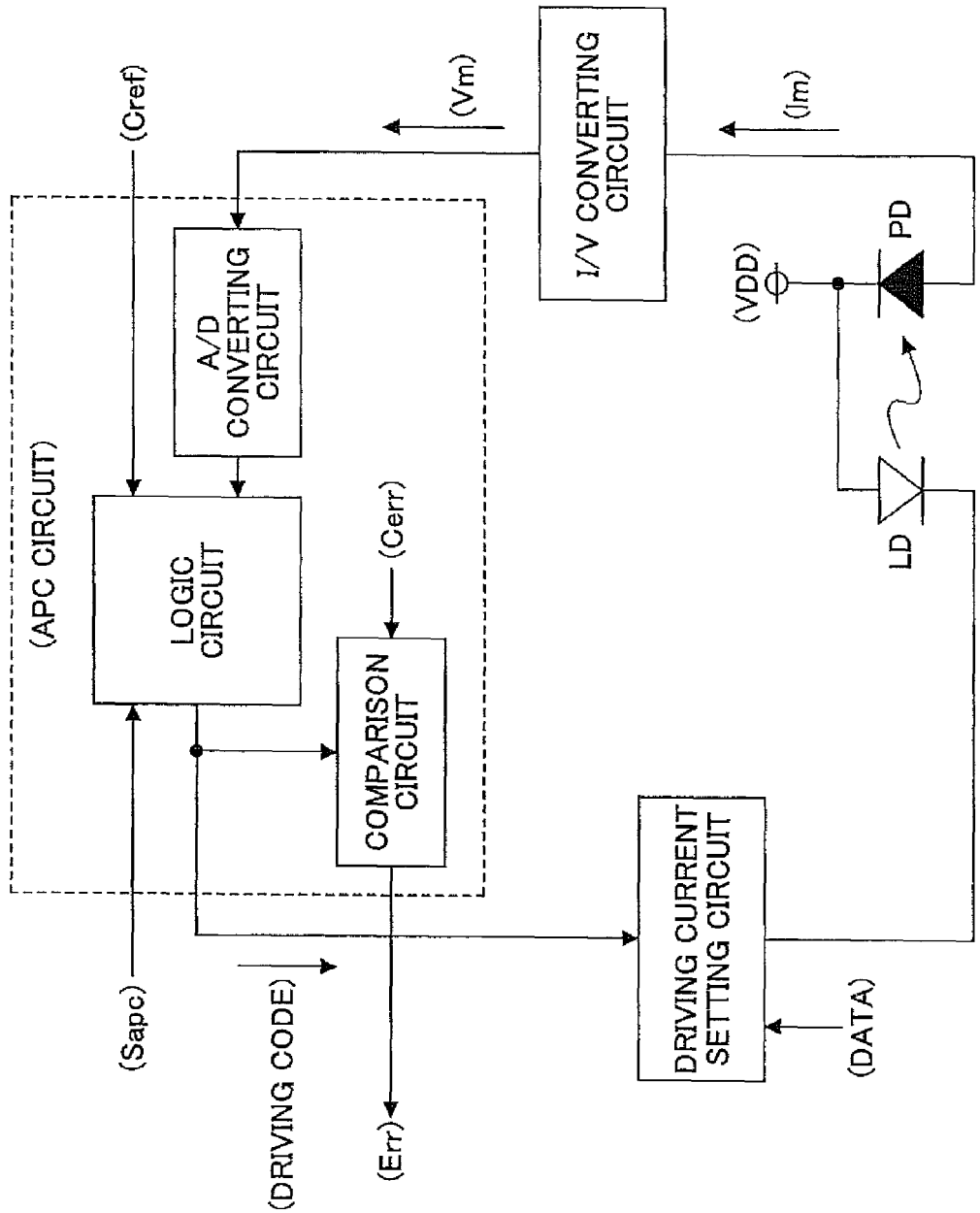
FIG. 13 is a schematic block diagram of a semiconductor laser driving device 1c in FIG. 12.

FIG. 13 is a schematic block diagram showing the configuration of FIG. 12. As may be apparent from FIG. 13, the size of the circuit in FIG. 13 is smaller than that of a conventional circuit in FIG. 18. Further, unlike the circuit in FIG. 18, the circuit in FIG. 13 is not directly affected by the parasitic capacitance and the input leakage current. In FIG. 13, the I/V converting circuit corresponds to the variable resistor Rpd. The A/D converting circuit of the APC circuit corresponds to each of the A/D converting circuits 21 and 22. The logic circuit and the comparison circuit correspond to the APC logic circuits 23 and 24, respectively. Further, in FIG. 13, the driving current setting circuit corresponds to the bias current generating circuit 3c and the switching current generating circuit 4c.

Figure 14:
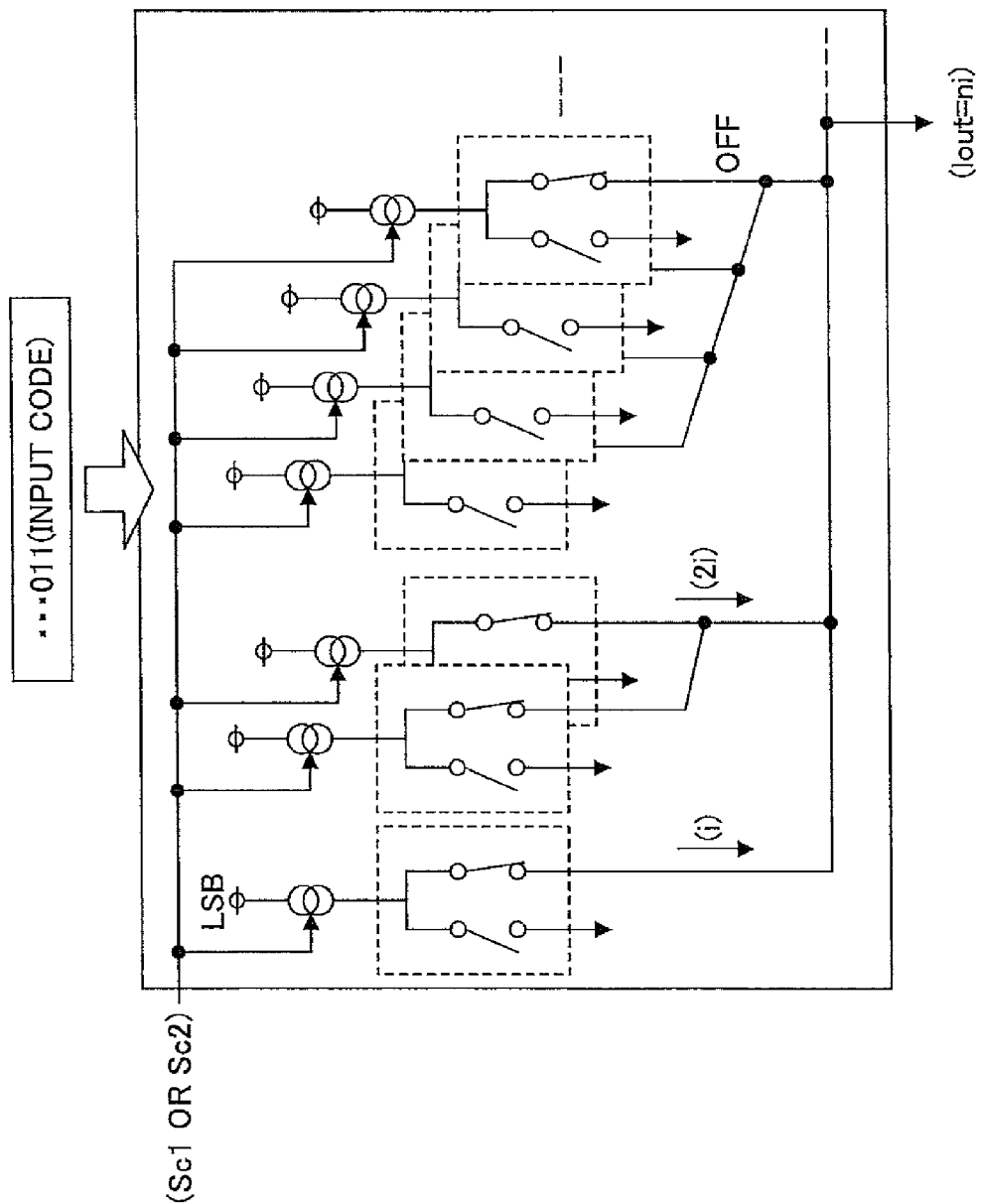
FIG. 14 is an exemplary circuit diagram of a D/A converting circuit 31 and 32 in FIG. 12.
Figure 15:
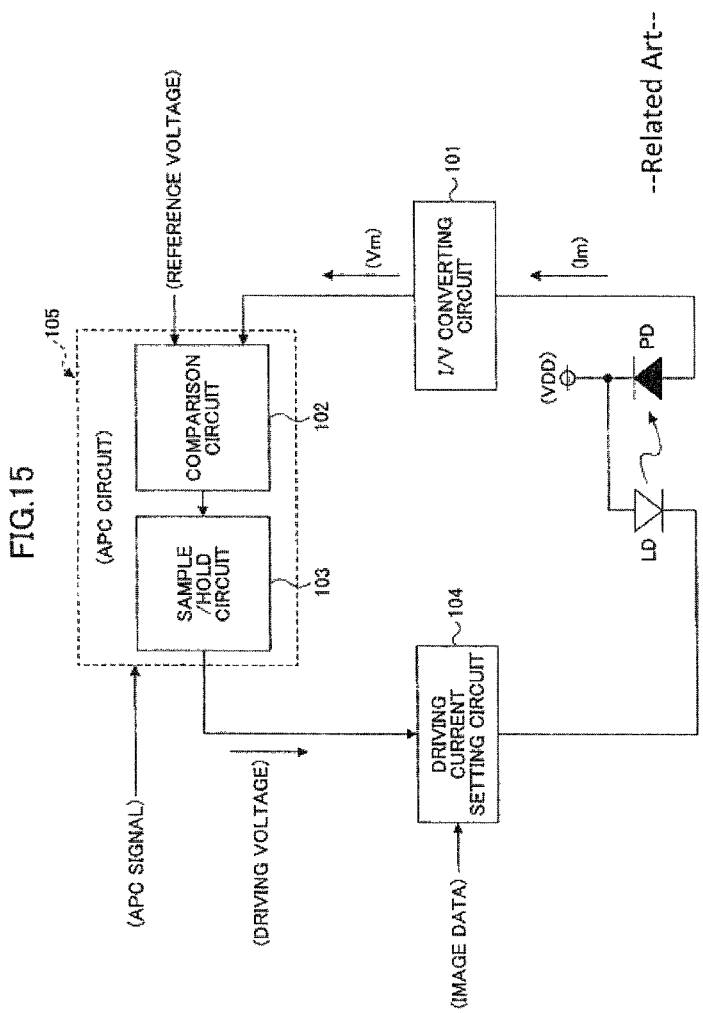
FIG. 15 is a schematic block diagram of a conventional semiconductor laser driving device.
Figure 16:
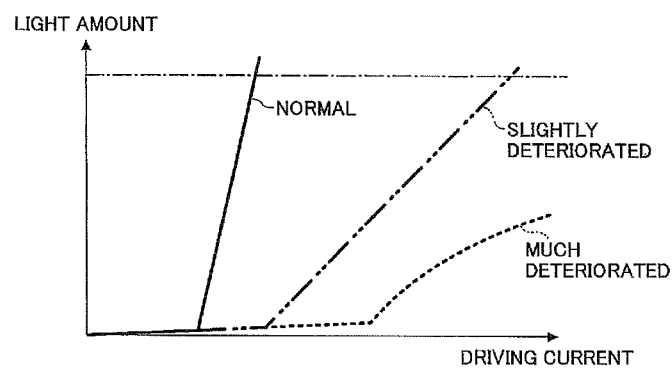
FIG. 16 is a graph showing the characteristics of a semiconductor laser LD when the semiconductor laser LD is deteriorated.
Figure 17:
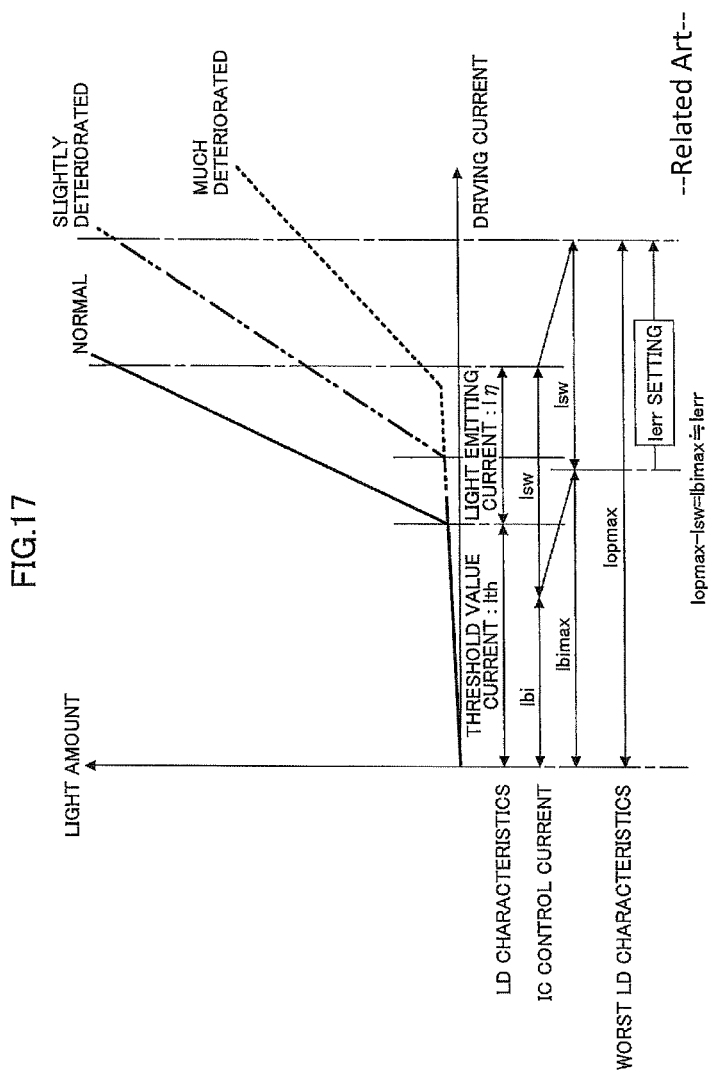
FIG. 17 is another graph showing the characteristics of a semiconductor laser LD when the semiconductor laser LD is deteriorated.

FIG. 14 shows a sample circuit diagram of the current output type D/A converting circuits 31 and 32 shown in FIG. 12.

As shown in FIG. 14, the current output type D/A converting circuits 31 and 32 have a different number of current cells corresponding to each bit. More specifically, the number of current cells with respect to each bit is set forth as follows: For the first bit, the number of current cells is $2^0$. For the second bit, the number of current cells is $2^1$ For the third bit, the number of current cells is $2^2$. For the $n^{th}$ bit, the number of current cells is $2^{(n-1)}$. By having this structure, each bit is weighted by the corresponding number of current cells and when the value of a bit is "1", a current flows from each of the current cell(s) corresponding to the bit. Namely, when the value of the "$n^{th}$" bit is "1", a current flows from each of the $2^{(n-1)}$ current cells corresponding to the "$n^{th}$" bit. In this case, each current cell has substantially the same shape and characteristics. Accordingly, by making it possible to externally set a constant current using the current cells, it may become possible to determine the full-scale currents of the bias current Ibi and the switching current Isw corresponding to the characteristics of each semiconductor laser LD by changing the full scale of the D/A converting circuit(s), thereby improving the accuracy of detecting the deterioration of the semiconductor laser LD.

In the above description, a case is described where the APC is performed with respect to both of the bias current Ibi and the switching current Isw. However, the APC may be performed with respect to only the bias current Ibi. In this case, the A/D converting circuit 22, the APC logic circuit 24, and the reference code setting circuit 26 may be removed so that the predetermined driving code Cdrv2 can be externally input. In the same manner, The APC may be performed with respect to only the switching current Isw. In this case, the A/D converting circuit 21, the APC logic circuit 23, and the reference code setting circuit 25 may be removed so that the predetermined driving code Cdrv1 can be externally input.

As described above, in the semiconductor laser driving device 1c according to the second embodiment of the present invention, when the bias current value indicated by the driving code Cdrv1 transmitted from the APC logic circuit 23 is greater than the current value indicated by the reference code Cerr1 and/or when the bias current value indicated by the driving code Cdrv2 transmitted from the APC logic circuit 24 is greater than the current value indicated by the reference code Cerr2, the predetermined deterioration detecting signal indicating that the semiconductor laser LD is deteriorated is output, thereby obtaining the same effects as those of the first embodiment of the present invention.

Further, by varying the values of the reference codes Cerr1 and Cerr2 in response to the characteristics of the semiconductor laser LD, it may become possible to further improve the accuracy of detecting the deterioration of the semiconductor laser LD.

Further, it may become possible to protect against the further deterioration of the semiconductor laser LD by setting "0" in the output code or limiting the setting to a certain output code of the APC logic circuit when the current value indicated by the driving code transmitted from the APC logic circuit is greater than that indicated by the corresponding reference code.

The semiconductor laser driving device according to the first or the second embodiment of the present invention may be used in an image forming apparatus such as a laser printer and a digital copier.

Further, in the first embodiment of the present invention, the reference voltage is determined as the divided voltage by dividing the voltage source VDD. However, the present invention is not limited to this method. For example, instead of using the divided voltage, a voltage generating circuit for generating the predetermined voltage may be used. In this case, the voltage generating circuit may include a unit for varying the reference voltage.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

The present application is based on and claims the benefit of priority of Japanese Patent Application No. 2007-339677, filed on Dec. 28, 2007, the entire contents of which are hereby incorporated herein by reference.

The invention claimed is:

1. A semiconductor laser driving device that includes a semiconductor laser driven by a driving current which is a combination of a bias current and a switching current and that is capable of automatically controlling a current supplied to the semiconductor laser so that a light amount of the semiconductor laser is substantially equal to a predetermined light amount, the semiconductor laser driving device comprising:
a switching current generating circuit unit generating the switching current in accordance with an input switching current setting signal and supplying the generated switching current to the semiconductor laser in accordance with an input control signal;
a bias current generating circuit unit generating the bias current in accordance with an input bias current setting voltage and supplying the generated bias current to the semiconductor laser;
a control circuit unit detecting an emitted light amount of the semiconductor laser and controlling an operation of the bias current generating circuit unit by generating the bias current setting voltage so that the detected emitted light amount is substantially equal to a desired value; and
a deterioration detecting circuit unit detecting a deterioration of the semiconductor laser based on the bias current setting voltage transmitted from the control circuit unit and generating and transmitting a deterioration detecting signal indicating a result of the deterioration detection,
wherein the deterioration detecting circuit unit is configured to generate and output the deterioration detecting signal indicating the deterioration detection of the semiconductor laser when the bias current setting voltage based on which the bias current generating circuit unit generates the bias current is equal to or greater than a reference voltage corresponding to a current value obtained by subtracting the switching current from a maximum driving current of the semiconductor laser,
wherein the bias current generating circuit unit includes a bias current setting resistor and a first voltage-current converting circuit connected to each other serially between the semiconductor laser and ground voltage, and the first voltage-current converting circuit controls a voltage output to a connection node between the bias current setting resistor and the first voltage-current converting circuit to match the bias current setting voltage and thereby convert the bias current setting voltage into a current flowing through the bias current setting resistor, and
wherein a resistance value rbi of the bias current setting resistor is set to match the following equation:

$$rbi = Verr/(Iop\max - Isw),$$

where Iopmax is a maximum value of a driving current in the bias current generating circuit unit, or the maximum driving current of the semiconductor laser,
Isw is a current value of the switching current, and
Verr is the reference voltage.

2. The semiconductor laser driving device according to claim 1, wherein
the control circuit unit controls the operation of the switching current generating circuit unit by generating the switching current setting signal so that the detected emitted light amount is substantially equal to a desired value, and
the deterioration detecting circuit unit detects a deterioration of the semiconductor laser based on the bias current setting voltage transmitted from the control circuit unit and the switching current setting signal, and generates and transmits a deterioration detecting signal indicating a result of the deterioration detection.

3. The semiconductor laser driving device according to claim 1, wherein the control circuit unit includes:
a light amount detecting circuit generating a monitoring voltage in accordance with the detected emitted light amount;
a first operational amplifier circuit amplifying a voltage difference between the monitoring voltage and a predetermined first reference voltage and transmitting the amplified voltage difference; and
a first sample/hold circuit sampling and holding the output voltage of the first operational amplifier circuit and generating the bias current setting voltage, wherein
when the bias current setting voltage generated by the first sample/hold circuit indicates that the bias current greater than a predetermined value is to be generated, the deterioration detecting circuit unit generates and transmits a predetermined deterioration detecting signal indicating that a deterioration of the semiconductor laser is detected.

4. The semiconductor laser driving device according to claim 3, wherein
when the deterioration of the semiconductor laser is detected, the deterioration detecting circuit unit causes the output terminal of the first sample/hold circuit to be connected to a predetermined voltage so that the bias current is decreased.

5. The semiconductor laser driving device according to claim 3, wherein the deterioration detecting circuit unit includes:
a first voltage generating circuit generating and transmitting a predetermined first voltage; and a first voltage comparison circuit comparing the output voltage of the first sample/hold circuit with the first voltage and generating and transmitting the deterioration detecting signal indicating the comparison result.

6. The semiconductor laser driving device according to claim 5, wherein
the first voltage generating circuit includes a unit to change the value of the first voltage.

7. The semiconductor laser driving device according to claim 1, wherein the control circuit unit includes:
a light amount detecting circuit generating a monitoring voltage in accordance with the detected emitted light amount; and
a first driving code generating circuit comparing a digital code obtained by A/D-converting the monitoring voltage with a predetermined first reference code, generating a first driving code indicating the comparison result, and transmitting the generated first driving code as the bias current setting voltage, wherein
when the first driving code indicates that the bias current greater than a predetermined value is to be generated, the deterioration detecting circuit unit generates and transmits a predetermined deterioration detecting signal indicating that a deterioration of the semiconductor laser is detected.

8. The semiconductor laser driving device according to claim 7, wherein the bias current generating circuit unit includes:
a first current-output-type D/A converting circuit generating and transmitting the bias current in accordance with the first driving code.

9. An image forming apparatus comprising:
a semiconductor laser driving device according to claim 1.

10. The semiconductor laser driving device according to claim 1, wherein the bias current setting resistor is disposed outside of an integrated circuit in which all of the circuit units are integrated.

11. A semiconductor laser driving device that includes a semiconductor laser driven by a driving current which is a combination of a bias current and a switching current and that is capable of automatically controlling a current supplied to the semiconductor laser so that a light amount of the semiconductor laser is substantially equal to a predetermined light amount, the semiconductor laser driving device comprising:
a switching current generating circuit unit generating the switching current in accordance with an input switching current setting signal and supplying the generated switching current to the semiconductor laser in accordance with an input control signal;
a bias current generating circuit unit generating the bias current in accordance with an input bias current setting voltage and supplying the generated bias current to the semiconductor laser;
a control circuit unit detecting an emitted light amount of the semiconductor laser and controlling an operation of the switching current generating circuit unit by generating the switching current setting signal so that the detected emitted light amount is substantially equal to a desired value; and
a deterioration detecting circuit unit detecting a deterioration of the semiconductor laser based on the switching current setting signal transmitted from the control circuit unit and generating and transmitting a deterioration detecting signal indicating a result of the deterioration detection,
wherein the deterioration detecting circuit unit is configured to generate and output the deterioration detecting signal indicating the deterioration detection of the semiconductor laser when a switching current setting voltage generating the switching current is equal to or greater than a reference voltage corresponding to a current value obtained by subtracting the bias current from a maximum driving current of the semiconductor laser,
wherein the bias current generating circuit unit includes a bias current setting resistor and a first voltage-current converting circuit connected to each other serially between the semiconductor laser and ground voltage, and the first voltage-current converting circuit controls a voltage output to a connection node between the bias current setting resistor and the first voltage-current converting circuit to match the bias current setting voltage and thereby convert the bias current setting voltage into a current flowing through the bias current setting resistor, and
wherein a resistance value rbi of the bias current setting resistor is set to match the following equation:

$$rbi = Verr/(Iop\max - Isw),$$

where $Iop\max$ is a maximum value of a driving current in the bias current generating circuit unit, or the maximum driving current of the semiconductor laser,
$Isw$ is a current value of the switching current, and
$Verr$ is the reference voltage.

12. The semiconductor laser driving device according to claim 11, wherein the control circuit unit includes:
a light amount detecting circuit generating a monitoring voltage in accordance with the detected emitted light amount;
a second operational amplifier circuit amplifying a voltage difference between the monitoring voltage and a predetermined second reference voltage and transmitting the amplified voltage difference; and
a second sample/hold circuit sampling and holding the output voltage of the second operational amplifier circuit and generating a voltage for the switching current setting signal, wherein
when the voltage generated by the second sample/hold circuit indicates that the switching current greater than a predetermined value is to be generated, the deterioration detecting circuit unit generates and transmits a predetermined deterioration detecting signal indicating that a deterioration of the semiconductor laser is detected.

13. The semiconductor laser driving device according to claim 12, wherein
when the deterioration of the semiconductor laser is detected, the deterioration detecting circuit unit causes the output terminal of the second sample/hold circuit to be connected to a predetermined voltage so that the switching current is decreased.

14. The semiconductor laser driving device according to claim 12, wherein the deterioration detecting circuit unit includes:
a second voltage generating circuit generating and transmitting a predetermined second voltage; and
a second voltage comparison circuit comparing the output voltage of the second sample/hold circuit with the second voltage and generating and transmitting the deterioration detecting signal indicating the comparison result.

15. The semiconductor laser driving device according to claim 14, wherein
the second voltage generating circuit includes a unit to change the value of the second voltage.

16. The semiconductor laser driving device according to claim 12, wherein the switching current generating circuit unit includes:

a second voltage-current converting circuit converting the voltage for the switching current setting signal into a current;

a switching current setting resistor through which the current converted by the second voltage-current converting circuit flows; and a switching current control switch controlling the output of the switching current generated by the second voltage-current converting circuit and the switching current setting resistor in response to an externally input signal.

17. The semiconductor laser driving device according to claim 16, wherein the switching current setting resistor is disposed outside of an integrated circuit in which all of the circuit units are integrated.

18. The semiconductor laser driving device according to claim 11, wherein the control circuit unit includes:

a light amount detecting circuit generating a monitoring voltage in accordance with the detected emitted light amount; and a second driving code generating circuit comparing a digital code obtained by A/D-converting the monitoring voltage with a predetermined second reference code and generating a second driving code indicating the comparison result as the switching current setting signal, wherein when the second driving code indicates that the switching current greater than a predetermined value is to be generated, the deterioration detecting circuit unit generates and transmits a predetermined deterioration detecting signal indicating that a deterioration of the semiconductor laser is detected.

19. The semiconductor laser driving device according to claim 18, wherein the switching current generating circuit unit includes:

a second current-output-type D/A converting circuit generating and transmitting the switching current in accordance with the second driving code; and a switching current control witch controlling the output of the switching current generated by the second D/A converting circuit in response to an externally input signal.

* * * * *